US012573466B2

(12) United States Patent
    Lee

(10) Patent No.: US 12,573,466 B2
(45) Date of Patent: Mar. 10, 2026

(54) SEMICONDUCTOR DEVICE FOR DETECTING DEFECT IN WORD LINE DRIVER

(71) Applicant: SK hynix Inc., Icheon-si (KR)

(72) Inventor: Byeong Cheol Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 204 days.

(21) Appl. No.: 18/341,607

(22) Filed: Jun. 26, 2023

(65) Prior Publication Data

US 2024/0290415 A1     Aug. 29, 2024

(30) Foreign Application Priority Data

Feb. 27, 2023     (KR) ........................ 10-2023-0026275

(51) Int. Cl.
    *G11C 29/46*     (2006.01)
    *G11C 29/36*     (2006.01)
    *G11C 29/12*     (2006.01)
(52) U.S. Cl.
    CPC .............. *G11C 29/46* (2013.01); *G11C 29/36* (2013.01); *G11C 2029/1202* (2013.01)
(58) Field of Classification Search
    CPC . G11C 29/46; G11C 29/36; G11C 2029/1202; G11C 29/12; G11C 29/025; G11C 11/4085; G11C 29/50012
    See application file for complete search history.

(56) References Cited

U.S. PATENT DOCUMENTS

| | | | |
|---|---|---|---|
| 2007/0171763 A1* | 7/2007 | Jung ........................ | G11C 7/22 |
| | | | 365/233.1 |
| 2014/0003170 A1* | 1/2014 | Ku .................. | G01R 31/318555 |
| | | | 324/538 |
| 2014/0003174 A1* | 1/2014 | Song ..................... | G11C 29/48 |
| | | | 365/201 |
| 2022/0270674 A1 | 8/2022 | Hsieh et al. | |

FOREIGN PATENT DOCUMENTS

| | | | |
|---|---|---|---|
| JP | 2003115199 A | * | 4/2003 |
| KR | 1020210079436 A | | 6/2021 |

* cited by examiner

*Primary Examiner* — Sultana Begum
(74) *Attorney, Agent, or Firm* — WILLIAM PARK AND ASSOCIATES LTD.

(57)          ABSTRACT

A semiconductor device includes a test control circuit configured to enter a test mode and configured to generate a test word line precharge signal, based on a test mode entry signal, an active pulse, a precharge pulse, a reset signal, and a test code; a mat including a plurality of word line drivers; and a word line control circuit configured to generate a word line driving signal, a plurality of voltage driving signals, and a plurality of voltage discharge signals for controlling operations of the plurality of word line drivers, based on the test word line precharge signal, a mat enable signal, and a plurality of internal addresses. The word line driving signal is a signal that is enabled after a start of an active operation and that is disabled after a set period from timing for a precharge operation.

15 Claims, 19 Drawing Sheets

| TCD<1> | TCD<2> | TM_WLP | TM_FBP | TM_FXP | TM_FDS |
|--------|--------|--------|--------|--------|--------|
| L | L | H | L | L | L |
| L | H | L | H | L | L |
| H | L | H | H | L | H |
| H | H | L | L | L | H |

BKEN →
TM_WLP →
TM_FBP →
TM_FXP →

310 — PERIOD SIG GEN

WLOFF →
FXBOFF →
FSHOFF →

320 — DRV SIG GEN

MTEN<1:2> →
IADD<1:8> →
TM_FDS →

→ MWL<1:2>
→ FX<1:8>
→ FXB<1:8>

SEMICONDUCTOR DEVICE FOR DETECTING DEFECT IN WORD LINE DRIVER

CROSS-REFERENCE TO RELATED APPLICATION

The present application claims priority under 35 U.S.C. § 119 (a) to Korean application number 10-2023-0026275, filed in the Korean Intellectual Property Office on Feb. 27, 2023, the entire disclosure of which is incorporated herein by reference.

BACKGROUND

1. Technical Field

Embodiments of the present disclosure generally relate to a semiconductor device, and more particularly, to a semiconductor device for detecting a defect in a word line driver.

2. Related Art

In general, a semiconductor memory device including double data rate synchronous DRAM (DDR SDRAM) performs read and write operations of data in response to a command that is input from an external device. In order to perform such read and write operations, the semiconductor memory device needs to include various circuits. Among the various circuits, word line drivers for activating word lines for performing the read and write operations are included in semiconductor memory device. The word line drivers are connected to the word lines, respectively, and each perform the read and write operations by activating any one of the word lines based on an address after the start of an active operation.

If a defect occurs in the plurality of word line drivers, a repair operation may be performed. There is a need for a test mode in which various defects are detected in order to prevent a defect which occurs while the plurality of word line drivers is used.

SUMMARY

In an embodiment, a semiconductor device may include a test control circuit configured to enter a test mode and configured to generate a test word line precharge signal, based on a test mode entry signal, an active pulse, a precharge pulse, a reset signal, and a test code; a mat comprising a plurality of word line drivers; and a word line control circuit configured to generate a word line driving signal, a plurality of voltage driving signals, and a plurality of voltage discharge signals for controlling operations of the plurality of word line drivers, based on the test word line precharge signal, a mat enable signal, and a plurality of internal addresses. The word line driving signal is a signal that is enabled after a start of an active operation and that is disabled after a set period from timing for a precharge operation.

In an embodiment, a semiconductor device may include a mat including a plurality of word line drivers respectively connected to a plurality of word lines. The plurality of word line drivers are configured to activate any one of the plurality of word lines, based on a word line driving signal, a plurality of voltage driving signals, and a plurality of voltage discharge signals that are selectively enabled, after a start of an active operation in a test mode. The plurality of word line drivers are configured to drive the plurality of word lines, respectively, to a voltage level of a ground voltage based on the word line driving signal, the plurality of voltage driving signals, and the plurality of voltage discharge signals that are delayed by a set period and selectively disabled, after a start of a precharge operation in the test mode.

BRIEF DESCRIPTION OF THE DRAWINGS

FIG. 1 is a block diagram illustrating a construction of a semiconductor device according to an embodiment of the present disclosure.

FIG. 5 is a table for describing an operation of the test control circuit illustrated in FIG. 2.

FIG. 6 is a block diagram illustrating a construction according to an embodiment of a word line control circuit that is included in the semiconductor device illustrated in FIG. 1.

FIG. 11 is a circuit diagram illustrating a construction according to an embodiment of a voltage discharge signal generation circuit that is included in the driving signal generation circuit illustrated in FIG. 8.

FIG. 13 is a circuit diagram illustrating a construction according to an embodiment of a first word line driver that is included in an internal control circuit illustrated in FIG. 12.

FIG. 19 is a diagram illustrating a construction according to an embodiment of an electronic system to which the semiconductor device illustrated in FIGS. 1 and 18 has been applied.

DETAILED DESCRIPTION

Figure 2:
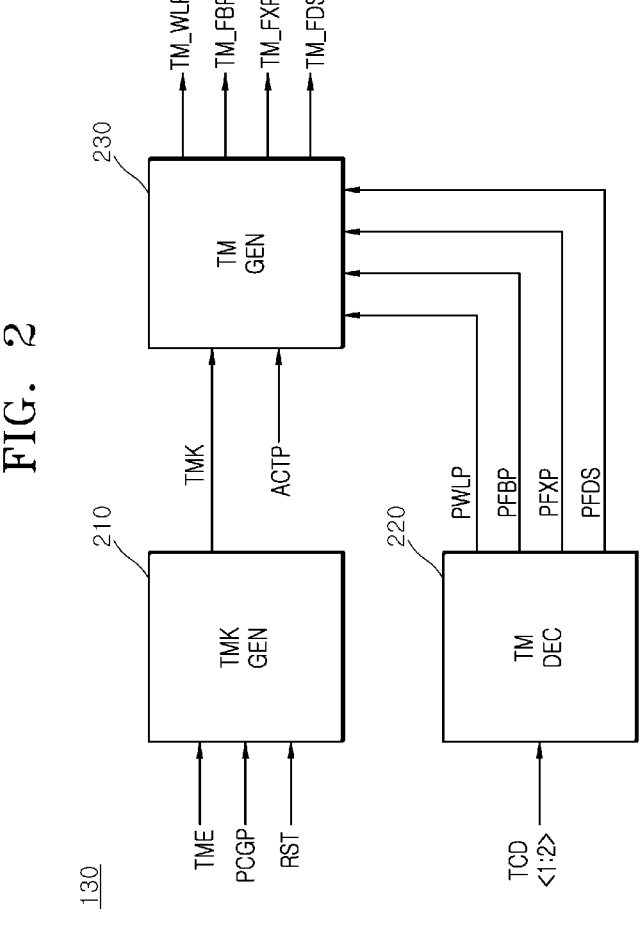
FIG. 2 is a block diagram illustrating a construction according to an embodiment of a test control circuit that is included in the semiconductor device illustrated in FIG. 1.

In the descriptions of the following embodiments, the term "preset" indicates that the numerical value of a parameter is previously decided, when the parameter is used in a process or algorithm. According to an embodiment, the numerical value of the parameter may be set when the process or algorithm is started or while the process or algorithm is performed.

Terms such as "first" and "second," which are used to distinguish among various components, are not limited by the components. For example, a first component may be referred to as a second component, and vice versa.

When one component is referred to as being "coupled" or "connected" to another component, it should be understood that the components may be directly coupled or connected to each other or coupled or connected to each other through another component interposed therebetween. In contrast, when one component is referred to as being "directly coupled" or "directly connected" to another component, it should be understood that the components are directly coupled or connected to each other without another component interposed therebetween.

A "logic high level" and a "logic low level" are used to describe the logic levels of signals. A signal having a "logic high level" is distinguished from a signal having a "logic low level." For example, when a signal having a first voltage corresponds to a signal having a "logic high level," a signal having a second voltage may correspond to a signal having a "logic low level." According to an embodiment, a "logic high level" may be set to a voltage higher than a "logic low level." According to an embodiment, the logic levels of signals may be set to different logic levels or opposite logic levels. For example, a signal having a logic high level may be set to have a logic low level in some embodiments, and a signal having a logic low level may be set to have a logic high level in some embodiments.

Hereafter, the present disclosure will be described in more detail through embodiments. The embodiments are only used to exemplify the present disclosure, and the scope of the present disclosure is not limited by the embodiments.

An embodiment of the present disclosure may provide a semiconductor device for detecting the levels of a plurality of word lines by selectively delaying timing at which signals are input to a plurality of word line drivers that is connected to the plurality of word lines are disabled, after the start of a precharge operation in a test mode.

According to an embodiment of the present disclosure, it is possible to detect a defect in the plurality of word line drivers by detecting the levels of a plurality of word lines, by delaying timing at which a word line driving signal that is input to the plurality of word line drivers connected to the plurality of word lines is disabled by a set period after the start of a precharge operation in a first test mode.

Furthermore, according to an embodiment of the present disclosure, it is also possible to detect a defect in the plurality of word line drivers by detecting the levels of a plurality of word lines, by delaying timing at which a voltage driving signal and a voltage discharge signal that are input to the plurality of word line drivers connected to the plurality of word lines are disabled by a set period after the start of a precharge operation in a second test mode.

Furthermore, according to an embodiment of the present disclosure, it is also possible to detect a defect in a plurality of word lines by detecting the levels of the plurality of word lines, by delaying timing at which a word line driving signal and a voltage driving signal that are input to the plurality of word line drivers connected to the plurality of word lines are disabled by a set period after the start of a precharge operation in a third test mode.

Furthermore, according to an embodiment of the present disclosure, it is also possible to detect a defect in a plurality of word lines by detecting the levels of the plurality of word lines by disabling a voltage driving signal in a fourth test mode.

According to an embodiment of the present disclosure, a semiconductor device for detecting a defect in a word line driver by selectively delaying and supplying a signal that is input to the word line driver and detecting the voltage level of a word line that is connected to the word line driver after the start of a precharge operation in a test mode may be provided.

Figure 1:
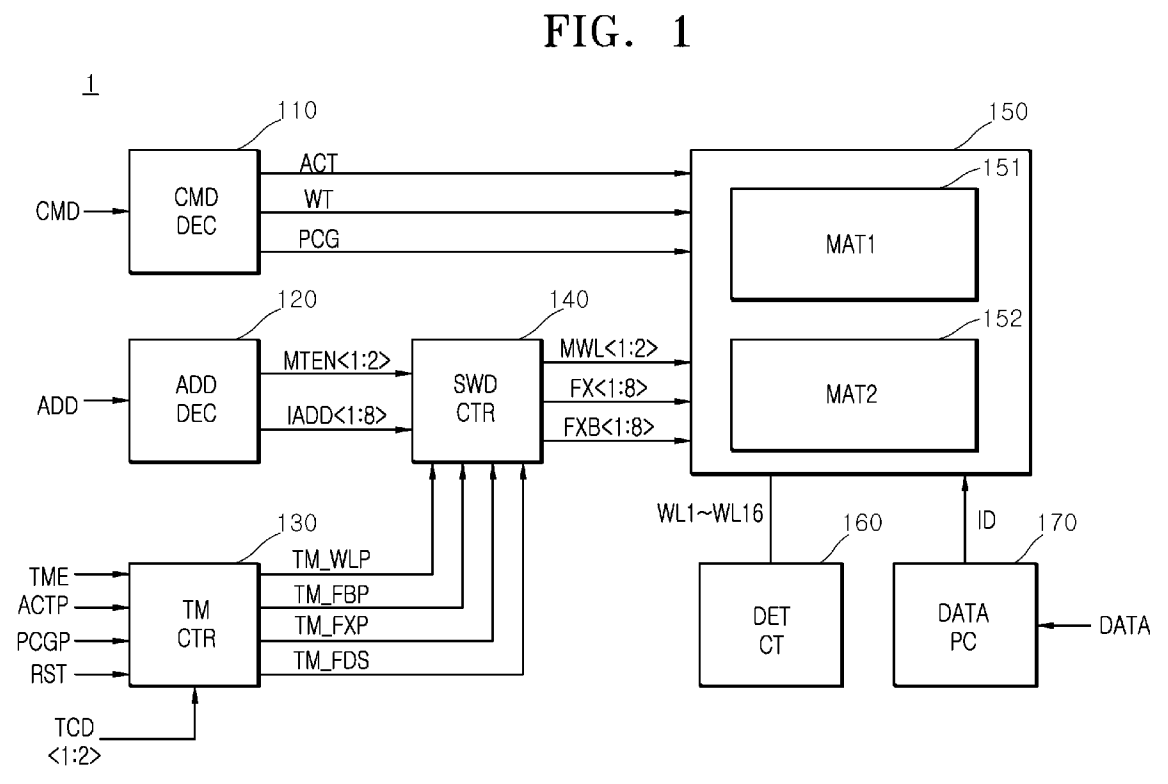

As illustrated in FIG. 1, a semiconductor device 1 according to an embodiment of the present disclosure may include a command decoder (CMD DEC) 110, an address decoder (ADD DEC) 120, a test control circuit (TM CTR) 130, a word line control circuit (SWD CTR) 140, a bank 150, a detection circuit (DET CT) 160, and a data processing circuit (DATA PC) 170.

The command decoder 110 may generate an active signal ACT, a write signal WT, and a precharge signal PCG, based on a command CMD. The command decoder 110 may generate the active signal ACT that is enabled when the command CMD has a logic level combination for performing an active operation. The command decoder 110 may generate the write signal WT that is enabled when the command CMD has a logic level combination for performing a write operation. The command decoder 110 may generate the precharge signal PCG that is enabled when the command CMD has a logic level combination for performing a precharge operation. The active operation may be set as an operation for activating first to sixteenth word lines WL1 to WL16 that are included in a first mat (MAT1) 151 and a second mat (MAT2) 152. The write operation may be set as an operation for storing data in a memory cell that is connected to an activated word line, among the first to sixteenth word lines WL1 to WL16, in an active operation. The precharge operation may be set as an operation for driving, to the voltage level of a ground voltage VSS, the first to sixteenth word lines WL1 to WL16 that are included in the first mat 151 and the second mat 152 and driving, to the level of a precharge voltage, bit line pairs that are connected to the first to sixteenth word lines WL1 to WL16 that are included in the first mat 151 and the second mat 152. As used herein, see for example FIG. 1, the tilde "~" indicates a range of components. For example, in FIG. 1, "WL1~WL16" indicates the word lines WL1, WL2, . . . , and WL16. The command CMD illustrated in FIG. 1 has been illustrated as one signal, but may be set as multiple signals having logic level combinations for performing an active operation, a write operation, and a precharge operation. The command decoder 110 illustrated in FIG. 1 may be implemented to generate various signals for performing a read operation, a refresh operation, etc. of the semiconductor device 1.

The address decoder 120 may generate first and second mat enable signals MTEN<1:2> and first to eighth internal addresses IADD<1:8> by decoding the address ADD. The address decoder 120 may generate the first mat enable signal MTEN<1> that is enabled when the address ADD has a logic level combination for activating any one of the first to eighth word lines WL1 to WL8 that are included in the first mat 151 and the first to eighth internal addresses IADD<1: 8> that are selectively enabled in order to activate any one of the first to eighth word lines WL1 to WL8. The address decoder 120 may generate the second mat enable signal MTEN<2> that is enabled when the address ADD has a logic level combination for activating any one of the ninth to sixteenth word lines WL9 to WL16 that are included in the second mat 152 and the first to eighth internal addresses IADD<1:8> that are selectively enabled in order to activate any one of the ninth to sixteenth word lines WL9 to WL16.

The test control circuit 130 may enter a test mode, and may generate a test word line precharge signal TM_WLP, a test discharge precharge signal TM_FBP, a test driving precharge signal TM_FXP, and a test driving disable signal TM_FDS that are selectively enabled based on the logic levels of first and second test codes TCD<1:2> after the start of an active operation. The test control circuit 130 may enter the test mode, and may generate the test word line precharge signal TM_WLP, the test discharge precharge signal TM_FBP, the test driving precharge signal TM_FXP, and the test driving disable signal TM_FDS that are selectively disabled after a set period from precharge operation timing. The test control circuit 130 may generate the test word line precharge signal TM_WLP, the test discharge precharge signal TM_FBP, the test driving precharge signal TM_FXP, and the test driving disable signal TM_FDS, based on a test mode entry signal TME, an active pulse ACTP, a precharge pulse PCGP, a reset signal RST, and the first and second test codes TCD<1:2>.

The word line control circuit 140 may generate first and second word line driving signals MWL<1:2>, first to eighth voltage driving signals FX<1:8>, and first to eighth voltage discharge signals FXB<1:8>, based on the test word line precharge signal TM_WLP, the test discharge precharge signal TM_FBP, the test driving precharge signal TM_FXP, the test driving disable signal TM_FDS, the first and second mat enable signals MTEN<1:2>, and the first to eighth internal addresses IADD<1:8>. The word line control circuit 140 may generate the first and second word line driving signals MWL<1:2>, based on the test word line precharge signal TM_WLP and the first and second mat enable signals MTEN<1:2>. The word line control circuit 140 may generate the first to eighth voltage driving signals FX<1:8>, based on the test driving precharge signal TM_FXP, the test driving disable signal TM_FDS, and the first to eighth internal addresses IADD<1:8>. The word line control circuit 140 may generate the first to eighth voltage discharge signals FXB<1:8>, based on the test discharge precharge signal TM_FBP and the first to eighth internal addresses IADD<1:8>.

The bank 150 may include the first mat 151 and the second mat 152.

The first mat 151 may perform an active operation when the active signal ACT is enabled after the start of an active operation. In the first mat 151, after the start of an active operation, the first word line driving signal MWL<1> may be enabled, and any one of the first to eighth word lines WL<1:8> may be activated based on the first to eighth voltage driving signals FX<1:8> and the first to eighth voltage discharge signals FXB<1:8>. The first mat 151 may perform a write operation when the write signal WT is enabled. The first mat 151 may store internal data ID in a memory cell (not illustrated) that is connected to an activated word line, among the first to eighth word lines WL<1:8>, after the start of a write operation. The first mat 151 may perform a precharge operation when the precharge signal PCG is enabled. The first mat 151 may drive the first to eighth word lines WL<1:8> to the voltage level of the ground voltage VSS, based on the first word line driving signal MWL<1>, the first to eighth voltage driving signals FX<1:8>, and the first to eighth voltage discharge signals FXB<1:8>, after the start of the precharge operation.

The second mat 152 may perform an active operation when the active signal ACT is enabled after the start of the active operation. In the second mat 152, after the start of an active operation, the second word line driving signal MWL<2> may be enabled, and any one of the ninth to sixteenth word lines WL<9:16> may be activated based on the first to eighth voltage driving signals FX<1:8> and the first to eighth voltage discharge signals FXB<1:8>. The second mat 152 may perform a write operation when the write signal WT is enabled. The second mat 152 may store the internal data ID in a memory cell (not illustrated) that is connected to an activated word line, among the ninth to sixteenth word lines WL<9:16>, in the write operation. The second mat 152 may perform a precharge operation when the precharge signal PCG is enabled. The second mat 152 may drive the ninth to sixteenth word lines WL<9:16> to the voltage level of the ground voltage VSS, based on the second word line driving signal MWL<2>, the first to eighth voltage driving signals FX<1:8>, and the first to eighth voltage discharge signals FXB<1:8>, after the start of the precharge operation.

The bank 150 may be implemented by a common memory cell array including multiple mats and multiple memory cells. The bank 150 has been implemented to include the first mat 151 and the second mat 152, but may be implemented to include various numbers of mats according to embodiments.

The detection circuit 160 may detect the voltage levels of the first to sixteenth word lines WL1 to WL16 after the start of a precharge operation. The detection circuit 160 may detect that a defect occurs in a word line driver that is connected to the first to sixteenth word lines WL1 to WL16 when at least any one of the first to sixteenth word lines WL1 to WL16 is not driven to the voltage level of the ground voltage VSS during a set period after the start of a precharge operation.

The data processing circuit 170 may generate the internal data ID based on data DATA after the start of a write operation. The data processing circuit 170 may generate the internal data ID based on the data DATA that is input from an external device after the start of a write operation.

FIG. 2 is a block diagram illustrating a construction according to an embodiment of the test control circuit 130 that is included in the semiconductor device 1. The test control circuit 130 may include a test mergence signal generation circuit (TMK GN) 210, a test decoder (TM DEC) 220, and a test signal generation circuit (TM GEN) 230.

The test mergence signal generation circuit 210 may generate a test mergence signal TMK that is enabled during a set period after a precharge operation, based on the test mode entry signal TME, the precharge pulse PCGP, and the reset signal RST. The test mode entry signal TME may be set as a signal that is enabled to a logic high level in order to enter the test mode. The precharge pulse PCGP may be set as a signal including a pulse having a logic high level, which is generated after the start of a precharge operation. The reset signal RST may be set as a signal including a pulse having a logic low level, which is generated after a set period from timing at which the precharge signal PCG is generated.

The test decoder 220 may generate a pre-word line precharge signal PWLP, a pre-discharge precharge signal PFBP, a pre-driving precharge signal PFXP, and a pre-driving disable signal PFDS that are selectively enabled based on the first and second test codes TCD<1:2>.

The test signal generation circuit 230 may generate the test word line precharge signal TM_WLP, the test discharge precharge signal TM_FBP, the test driving precharge signal TM_FXP, and the test driving disable signal TM_FDS, based on the active pulse ACTP, the test mergence signal TMK, the pre-word line precharge signal PWLP, the pre-discharge precharge signal PFBP, the pre-driving precharge signal PFXP, and the pre-driving disable signal PFDS. The test signal generation circuit 230 may generate the test word line precharge signal TM_WLP, the test discharge precharge signal TM_FBP, the test driving precharge signal TM_FXP, and the test driving disable signal TM_FDS that are enabled when the active pulse ACTP is enabled. The test signal generation circuit 230 may generate the test word line precharge signal TM_WLP, the test discharge precharge signal TM_FBP, the test driving precharge signal TM_FXP, and the test driving disable signal TM_FDS that are enabled based on the pre-word line precharge signal PWLP, the pre-discharge precharge signal PFBP, the pre-driving precharge signal PFXP, and the pre-driving disable signal PFDS when the test mergence signal TMK is enabled. The active pulse ACTP may be set as a signal including a pulse having a logic low level, which is generated after the start of an active operation.

Figure 3:
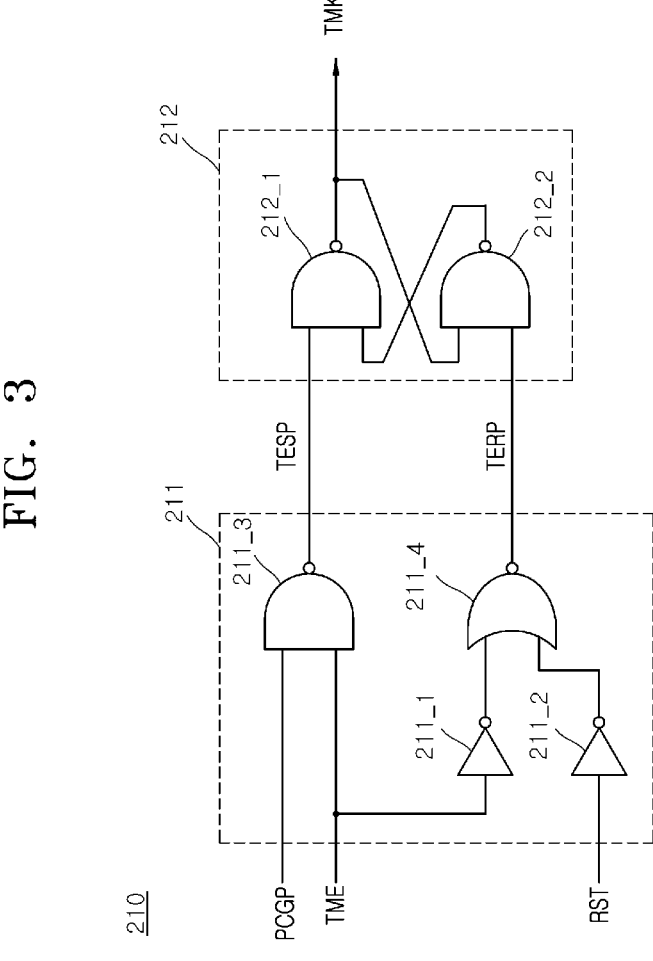
FIG. 3 is a circuit diagram illustrating a construction according to an embodiment of a test mergence signal generation circuit that is included in the test control circuit illustrated in FIG. 2.

FIG. 3 is a block diagram illustrating a construction according to an embodiment of the test mergence signal generation circuit 210 that is included in the test control circuit 130. The test mergence signal generation circuit 210 may include a test pulse generation circuit 211 and a latch circuit 212.

The test pulse generation circuit 211 may be implemented by inverters 211_1 and 211_2, a NAND gate 211_3, and a NOR gate 211_4. The test pulse generation circuit 211 may generate a test set pulse TESP, based on the test mode entry signal TME and the precharge pulse PCGP. The test pulse generation circuit 211 may generate the test set pulse TESP that is enabled to a logic low level when the precharge pulse PCGP having a logic high level is input during an interval in which the test mode entry signal TME is enabled. The test pulse generation circuit 211 may generate a test reset pulse TERP, based on the test mode entry signal TME and the reset signal RST. The test pulse generation circuit 211 may generate the test reset pulse TERP that is enabled to a logic low level when the test mode entry signal TME having a logic low level is input. The test pulse generation circuit 211 may generate the test reset pulse TERP that is enabled to a logic low level when the reset signal RST having a logic low level is input.

The latch circuit 212 may be implemented by NAND gates 212_1 and 212_2. The latch circuit 212 may generate the test mergence signal TMK that is enabled to a logic high level when the test set pulse TESP having a logic low level is input. The latch circuit 212 may generate the test mergence signal TMK that is disabled to a logic low level when the test reset pulse TERP having a logic low level is input. The latch circuit 212 may generate the test mergence signal TMK that is enabled to a logic high level from timing at which the test set pulse TESP having a logic low level is input to timing at which the test reset pulse TERP having a logic low level is input. The test mergence signal TMK may be generated as a signal that is enabled to a logic high level during a set period from precharge operation timing of the test mode.

Figure 4:
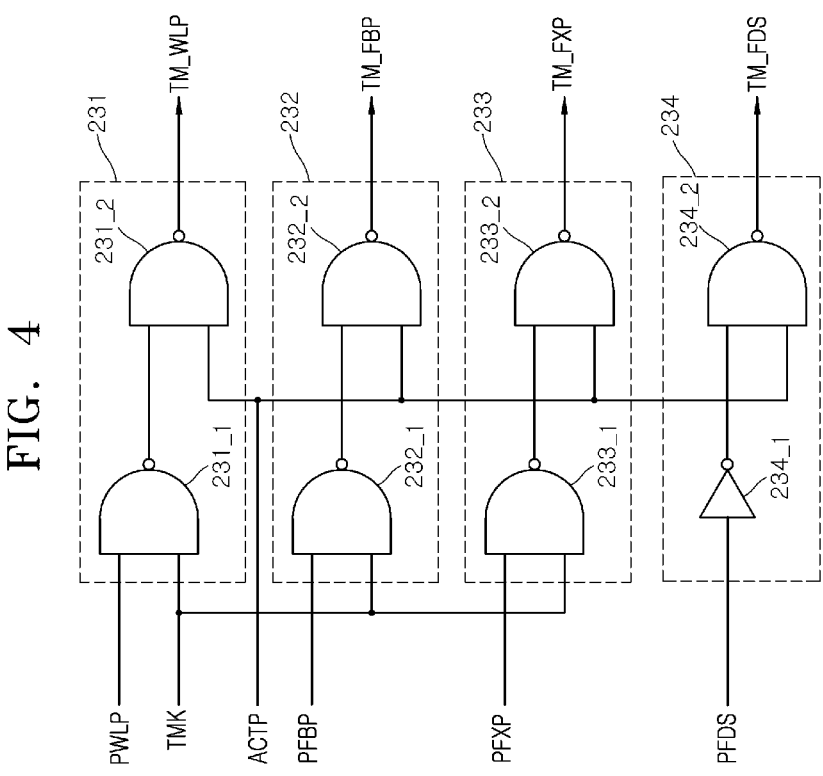
FIG. 4 is a circuit diagram illustrating a construction according to an embodiment of a test signal generation circuit that is included in the test control circuit illustrated in FIG. 2.

FIG. 4 is a circuit diagram illustrating a construction according to an embodiment of the test signal generation circuit 230 that is included in the test control circuit 130. The test signal generation circuit 230 may include a first logic circuit 231, a second logic circuit 232, a third logic circuit 233, and a fourth logic circuit 234.

The first logic circuit 231 may be implemented by NAND gates 231_1 and 231_2. The first logic circuit 231 may generate the test word line precharge signal TM_WLP having a logic high level, when the active pulse ACTP having a logic low level is input. The first logic circuit 231 may generate the test word line precharge signal TM_WLP having a logic high level, when the test mergence signal TMK and the pre-word line precharge signal PWLP each having a logic high level are input.

The second logic circuit 232 may be implemented by NAND gates 232_1 and 232_2. The second logic circuit 232 may generate the test discharge precharge signal TM_FBP having a logic high level, when the active pulse ACTP having a logic low level is input. The second logic circuit 232 may generate the test discharge precharge signal TM_FBP having a logic high level, when the test mergence signal TMK and the pre-discharge precharge signal PFBP each having a logic high level are input.

The third logic circuit 233 may be implemented by the NAND gates 233_1 and 233_2. The third logic circuit 233 may generate the test driving precharge signal TM_FXP having a logic high level, when the active pulse ACTP having a logic low level is input. The third logic circuit 233 may generate the test driving precharge signal TM_FXP having a logic high level, when the test mergence signal TMK and the pre-driving precharge signal PFXP each having a logic high level is input.

The fourth logic circuit 234 may be implemented by NAND gates 234_1 and 234_2. The fourth logic circuit 234 may generate the test driving disable signal TM_FDS having a logic high level, when the active pulse ACTP having a logic low level is input. The fourth logic circuit 234 may generate the test driving disable signal TM_FDS having a logic high level, when the test mergence signal TMK and the pre-driving disable signal PFDS each having a logic high level is input.

An operation of generating the test word line precharge signal TM_WLP, the test discharge precharge signal TM_FBP, the test driving precharge signal TM_FXP, and the test driving disable signal TM_FDS based on a logic level combination of the first and second test codes TCD<1:2> for performing the test mode is described as follows with reference to FIG. 5.

Prior to a description, the test mode may include a first test mode, a second test mode, a third test mode, and a fourth test mode.

The first test mode may be set as an operation of detecting a defect in a discharge element that is included in a word line driver by delaying timing at which the first and second word line driving signals MWL<1:2> are disabled by a set period.

The second test mode may be set as an operation of detecting a defect in the first and second word line driving signals MWL<1:2> that are input to a pull-up element and a pull-down element that are included in a word line driver by delaying timing at which the first to eighth voltage driving signals FX<1:8> and the first to eighth voltage discharge signals FXB<1:8> are disabled by a set period.

The third test mode may be set as an operation of detecting a defect in the first to sixteenth word lines WL1 to WL16 that are connected to a word line driver by delaying timing at which the first and second word line driving signals MWL<1:2> and the first to eighth voltage discharge signals FXB<1:8> are disabled by a set period.

The fourth test mode may be set as an operation of detecting a defect in the first to sixteenth word lines WL1 to WL16 that are connected to a word line driver by disabling the first to eighth voltage driving signals FX<1:8>.

The test control circuit 130 may generate the test word line precharge signal TM_WLP that is enabled to a logic high level when the first test code TCD<1> having a logic low level and the second test code TCD<2> having a logic low level for performing the first test mode are input.

The test control circuit 130 may generate the test discharge precharge signal TM_FBP that is enabled to a logic high level when the first test code TCD<1> having a logic low level and the second test code TCD<2> having a logic high level for performing the second test mode are input. According to embodiments, the test control circuit 130 may generate the test driving precharge signal TM_FXP that is enabled to a logic high level when the first test code TCD<1> having a logic low level and the second test code TCD<2> having a logic high level for performing the second test mode are input.

The test control circuit 130 may generate the test word line precharge signal TM_WLP, the test discharge precharge signal TM_FBP, and the test driving disable signal TM_FDS that are enabled to a logic high level when the first test code TCD<1> having a logic high level and the second test code TCD<2> having a logic low level for performing the third test mode are input.

The test control circuit 130 may generate the test driving disable signal TM_FDS that is enabled to a logic high level when the first test code TCD<1> having a logic high level and the second test code TCD<2> having a logic high level for performing the fourth test mode are input.

Figure 6:
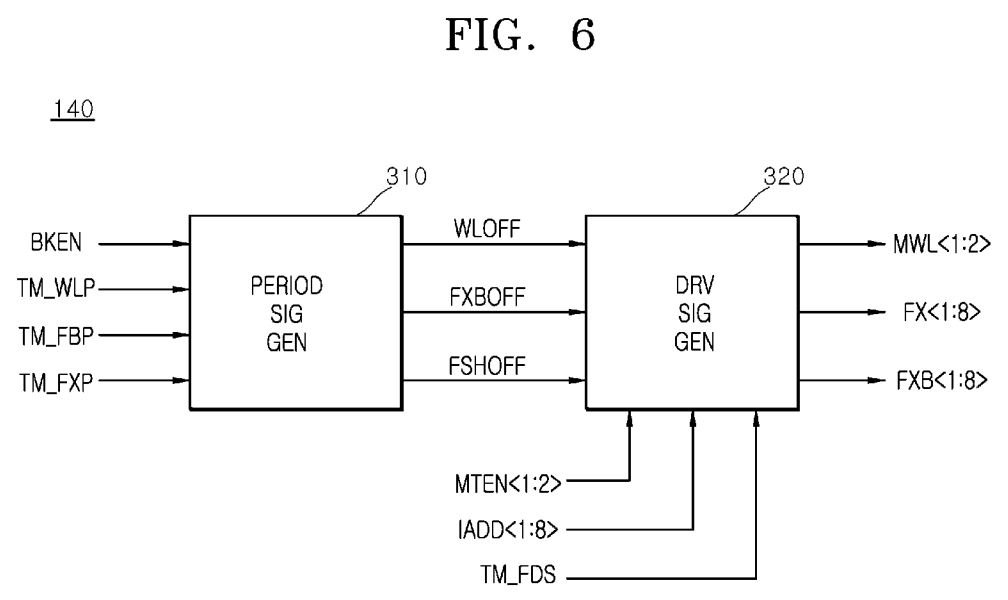

FIG. 6 is a block diagram illustrating a construction according to an embodiment of the word line control circuit 140 that is included in the semiconductor device 1. The word line control circuit 140 may include a period signal generation circuit (PERIOD SIG GEN) 310 and a driving signal generation circuit (DRV SIG GEN) 320.

The period signal generation circuit 310 may generate a word line period signal WLOFF, a discharge period signal FXBOFF, and a driving voltage period signal FSHOFF, based on a bank enable signal BKEN, the test word line precharge signal TM_WLP, the test discharge precharge signal TM_FBP, and the test driving precharge signal TM_FXP. The bank enable signal BKEN may be set as a signal that is enabled to a logic low level after the start of an active operation of the bank 150 and that is disabled to a logic high level after the start of a precharge operation of the bank 150.

The driving signal generation circuit 320 may generate the first and second word line driving signals MWL<1:2>, the first to eighth voltage driving signals FX<1:8>, and the first to eighth voltage discharge signals FXB<1:8>, based on the word line period signal WLOFF, the discharge period signal FXBOFF, the driving voltage period signal FSHOFF, the test driving disable signal TM_FDS, the first and second mat enable signals MTEN<1:2>, and the first to eighth internal addresses IADD<1:8>.

Figure 7:
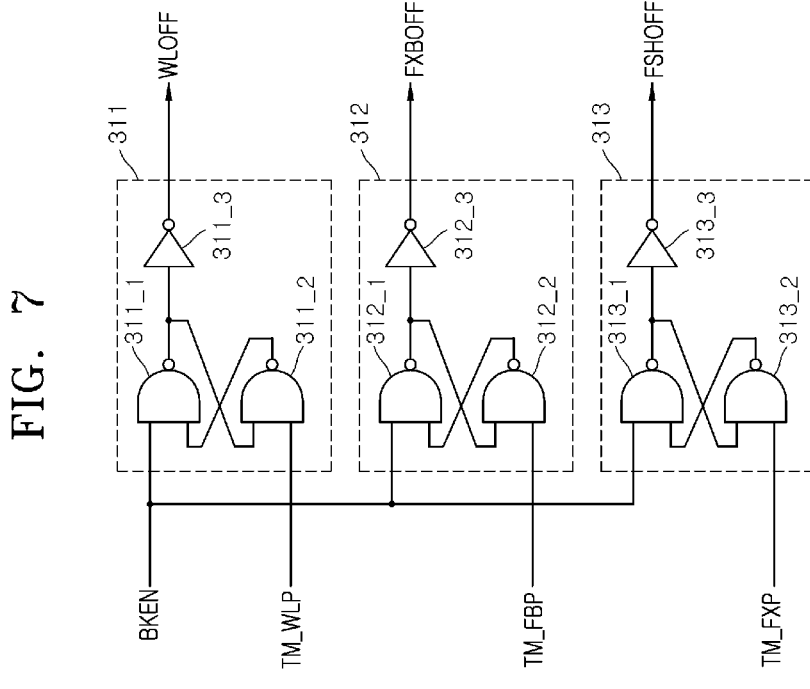
FIG. 7 is a circuit diagram illustrating a construction according to an embodiment of a period signal generation circuit that is included in the word line control circuit illustrated in FIG. 6.

FIG. 7 is a circuit diagram illustrating a construction according to an embodiment of the period signal generation circuit 310 that is included in the word line control circuit 140. The period signal generation circuit 310 may include a first period signal generation circuit 311, a second period signal generation circuit 312, and a third period signal generation circuit 313.

The first period signal generation circuit 311 may be implemented by NAND gates 311_1 and 311_2 and an inverter 311_3. The first period signal generation circuit 311 may generate the word line period signal WLOFF that is disabled to a logic low level when the bank enable signal BKEN having a logic low level is input. The first period signal generation circuit 311 may generate the word line period signal WLOFF that is enabled to a logic high level when the test word line precharge signal TM_WLP having a logic low level is input.

The second period signal generation circuit 312 may be implemented by NAND gates 312_1 and 312_2 and an inverter 312_3. The second period signal generation circuit 312 may generate the discharge period signal FXBOFF that is disabled to a logic low level when the bank enable signal BKEN having a logic low level is input. The second period signal generation circuit 312 may generate the discharge period signal FXBOFF that is enabled to a logic high level when the test discharge precharge signal TM_FBP having a logic low level is input.

The third period signal generation circuit 313 may be implemented by NAND gates 313_1 and 313_2 and an inverter 313_3. The third period signal generation circuit 313 may generate the driving voltage period signal FSHOFF that is disabled to a logic low level when the bank enable signal BKEN having a logic low level is input. The third period signal generation circuit 313 may generate the driving voltage period signal FSHOFF that is enabled to a logic high level when the test driving precharge signal TM_FXP having a logic low level is input.

Figure 8:
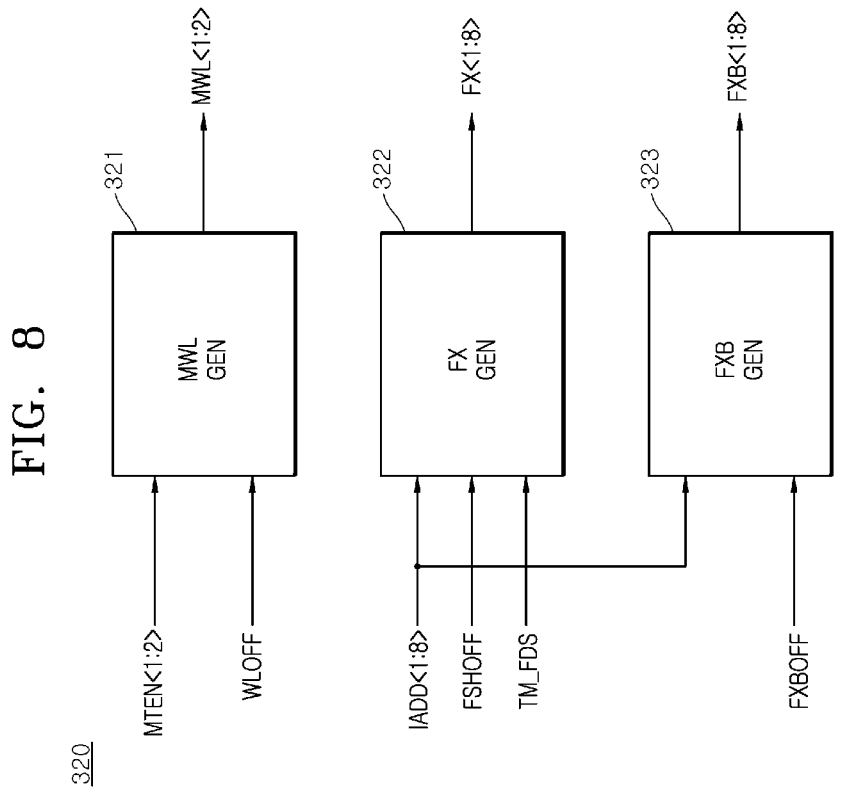
FIG. 8 is a block diagram illustrating a construction according to an embodiment of a driving signal generation circuit that is included in the word line control circuit illustrated in FIG. 6.

FIG. 8 is a block diagram illustrating a construction according to an embodiment of the driving signal generation circuit 320 that is included in the word line control circuit 140. The driving signal generation circuit 320 may include a word line driving signal generation circuit (MWL GEN) 321, a voltage driving signal generation circuit (FX GEN) 322, and a voltage discharge signal generation circuit (FXB GEN) 323.

The word line driving signal generation circuit 321 may generate the first and second word line driving signals MWL<1:2>, based on the word line period signal WLOFF and the first and second mat enable signals MTEN<1:2>. The word line driving signal generation circuit 321 may generate the first and second word line driving signals MWL<1:2> based on the first and second mat enable signals MTEN<1:2> when the word line period signal WLOFF is enabled.

The voltage driving signal generation circuit 322 may generate the first to eighth voltage driving signals FX<1:8>, based on the driving voltage period signal FSHOFF, the test driving disable signal TM_FDS, and the first to eighth internal addresses IADD<1:8>. The voltage driving signal generation circuit 322 may generate the first to eighth voltage driving signals FX<1:8> all of which are disabled in an initialization operation. The initialization operation may be set as an operation of the semiconductor device 1 starting an operation.

The voltage discharge signal generation circuit 323 may generate the first to eighth voltage discharge signals FXB<1:8>, based on the discharge period signal FXBOFF and the first to eighth internal addresses IADD<1:8>. The voltage discharge signal generation circuit 323 may generate the first to eighth voltage discharge signals FXB<1:8> based on the first to eighth internal addresses IADD<1:8> when the discharge period signal FXBOFF is enabled.

Figure 9:
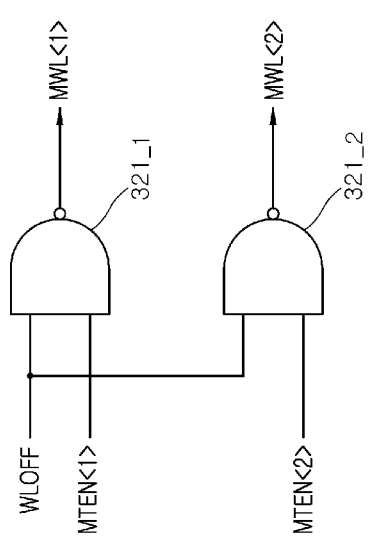
FIG. 9 is a circuit diagram illustrating a construction according to an embodiment of a word line driving signal generation circuit that is included in the driving signal generation circuit illustrated in FIG. 8.

FIG. 9 is a circuit diagram illustrating a construction according to an embodiment of the word line driving signal generation circuit 321 that is included in the driving signal generation circuit 320. The word line driving signal generation circuit 321 may be implemented by NAND gates 321_1 and 321_2.

The word line driving signal generation circuit 321 may generate the first word line driving signal MWL<1> by inverting the first mat enable signal MTEN<1> when the word line period signal WLOFF is enabled to a logic high level. The word line driving signal generation circuit 321 may generate the first word line driving signal MWL<1> that is enabled to a logic low level, when the word line period signal WLOFF is enabled to a logic high level and the first mat enable signal MTEN<1> having a logic high level is input. The word line driving signal generation circuit 321 may generate the first word line driving signal MWL<1> that is disabled to a logic high level when the word line period signal WLOFF is disabled to a logic low level.

The word line driving signal generation circuit 321 may generate the second word line driving signal MWL<2> by inverting the second mat enable signal MTEN<2> when the word line period signal WLOFF is enabled to a logic high level. The word line driving signal generation circuit 321 may generate the second word line driving signal MWL<2> that is enabled to a logic low level, when the word line period signal WLOFF is enabled to a logic high level and the second mat enable signal MTEN<2> having a logic high level is input. The word line driving signal generation circuit 321 may generate the second word line driving signal MWL<2> that is disabled to a logic high level when the word line period signal WLOFF is disabled to a logic low level.

Figure 10:
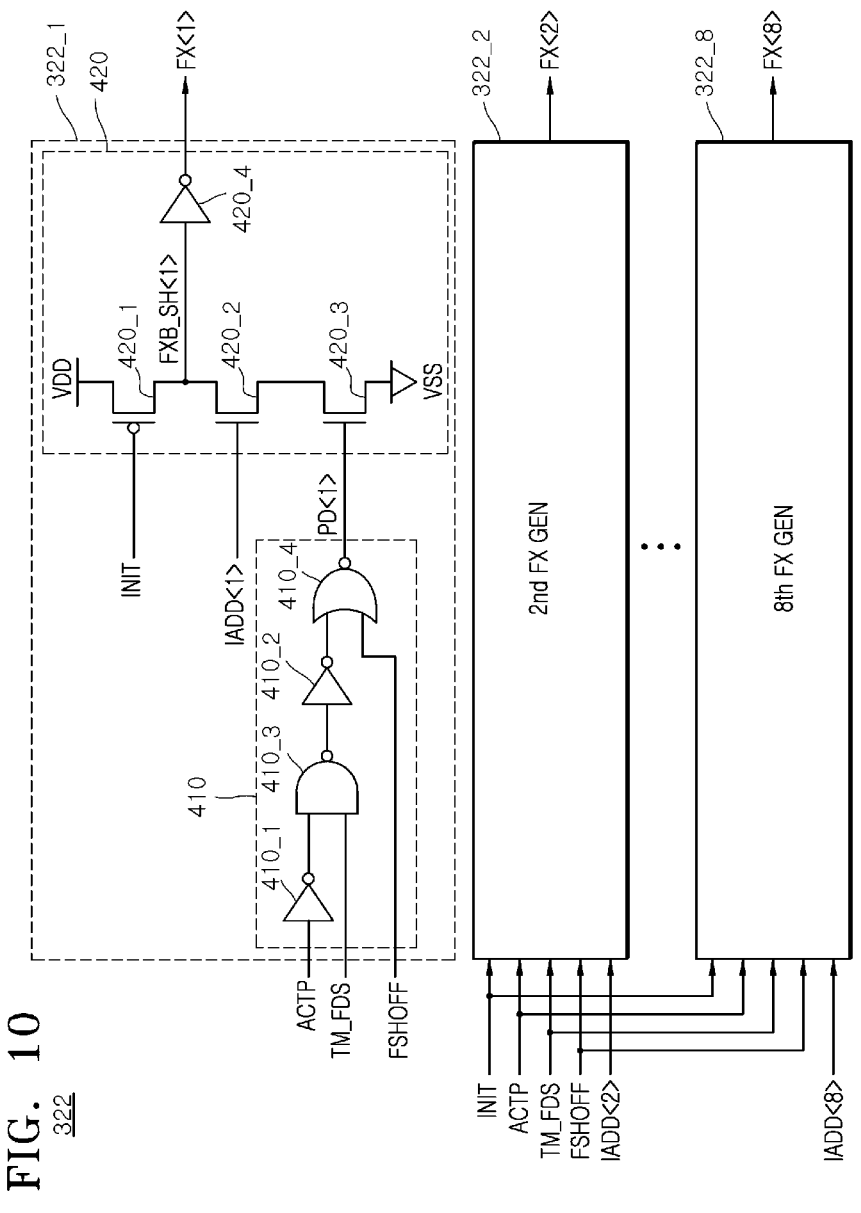
FIG. 10 is a diagram illustrating a construction according to an embodiment of a voltage driving signal generation circuit that is included in the driving signal generation circuit illustrated in FIG. 8.

FIG. 10 is a diagram illustrating a construction according to an embodiment of the voltage driving signal generation circuit 322 that is included in the driving signal generation circuit 320. The voltage driving signal generation circuit 322 may include first to eighth voltage driving signals generation circuits 322_1 to 322_8.

The first voltage driving signal generation circuit 322_1 may include a first pull-down signal generation circuit 410 and a first driving circuit 420.

The first pull-down signal generation circuit 410 may be implemented by inverters 410_1 and 410_2, a NAND gate 410_3, and a NOR gate 410_4. The first pull-down signal generation circuit 410 may generate a first pull-down signal PD<1> that is enabled to a logic high level, when the level of the active pulse ACTP is a logic low level, the level of the test driving disable signal TM_FDS is a logic low level, and the level of the voltage period signal FSHOFF is a logic low level.

The first driving circuit 420 may be implemented by a PMOS transistor 420_1, NMOS transistors 420_2 and 420_3, and an inverter 420_4. The first driving circuit 420 may generate a first pre-voltage driving signal FXB_SH<1> having a logic high level by driving the first pre-voltage driving signal FXB_SH<1> to the level of a power supply voltage VDD, when an initialization signal INIT is enabled to a logic low level after the start of the initialization operation. The first driving circuit 420 may generate the first voltage driving signal FX<1> having a logic low level by inverting the first pre-voltage driving signal FXB_SH<1> when the initialization signal INIT is enabled to a logic low level after the start of the initialization operation. The first driving circuit 420 may generate the first pre-voltage driving signal FXB_SH<1> having a logic low level, when the level of the first pull-down signal PD<1> is a logic high level and the level of the first internal address IADD<1> is a logic high level. The first driving circuit 420 may generate the first voltage driving signal FX<1> having a logic high level by inverting the first pre-voltage driving signal FXB_SH<1> having a logic low level, when the level of the first pull-down signal PD<1> is a logic high level and the level of the first internal address IADD<1> is a logic high level. In an embodiment, the NMOS transistor 420_3 may be coupled between the NMOS transistor 420_2 and a ground voltage VSS.

The second to eighth voltage driving signal generation circuits 322_2 to 322_8 merely generate the second to eighth voltage driving signals FX<2:8> by receiving the second to eighth internal addresses IADD<2:8>, respectively, and may each be implemented by the same circuits as the first voltage driving signal generation circuit 322_1 and may each perform the same operation as the first voltage driving signal generation circuit 322_1. Accordingly, a detailed description of the second to eighth voltage driving signal generation circuits 322_2 to 322_8 is omitted.

Figure 11:
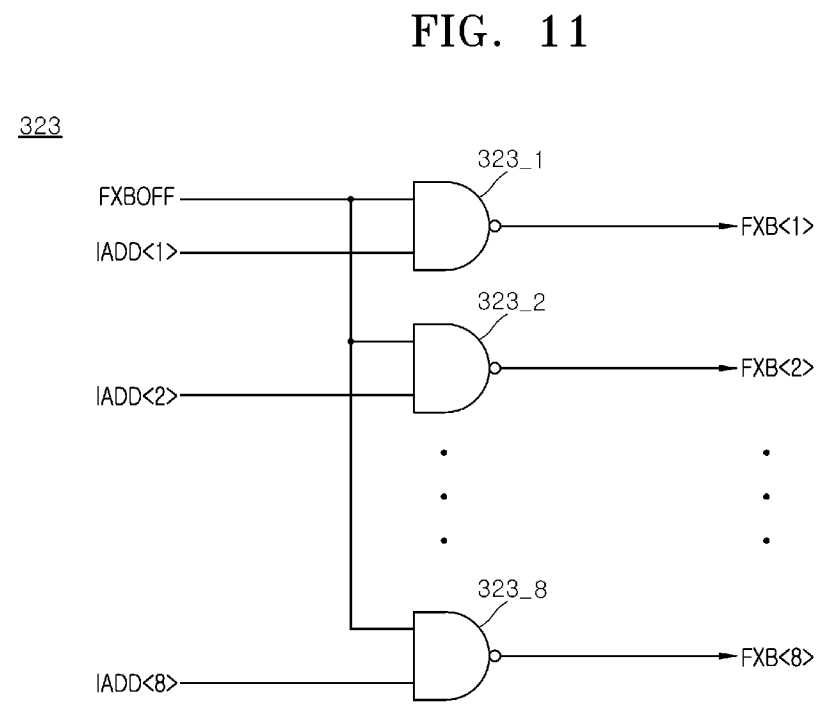

FIG. 11 is a circuit diagram illustrating a construction according to an embodiment of the voltage discharge signal generation circuit 323 that is included in the driving signal generation circuit 320. The voltage discharge signal generation circuit 323 may be implemented by NAND gates 323_1 to 321_8.

The voltage discharge signal generation circuit 323 may generate the first voltage discharge signal FXB<1> by inverting the first internal address IADD<1> when the discharge period signal FXBOFF is enabled to a logic high level. The voltage discharge signal generation circuit 323 may generate the first voltage discharge signal FXB<1> that is enabled to a logic high level when the discharge period signal FXBOFF is disabled to a logic low level.

The voltage discharge signal generation circuit 323 may generate the second voltage discharge signal FXB<2> by inverting the second internal address IADD<2> when the discharge period signal FXBOFF is enabled to a logic high level. The voltage discharge signal generation circuit 323 may generate the second voltage discharge signal FXB<2> that is enabled to a logic high level when the discharge period signal FXBOFF is disabled to a logic low level.

The voltage discharge signal generation circuit 323 may generate the third voltage discharge signal FXB<3> by inverting the third internal address IADD<3> when the discharge period signal FXBOFF is enabled to a logic high level. The voltage discharge signal generation circuit 323 may generate the third voltage discharge signal FXB<3> that is enabled to a logic high level when the discharge period signal FXBOFF is disabled to a logic low level.

The voltage discharge signal generation circuit 323 may generate the fourth voltage discharge signal FXB<4> by inverting the fourth internal address IADD<4> when the discharge period signal FXBOFF is enabled to a logic high level. The voltage discharge signal generation circuit 323 may generate the fourth voltage discharge signal FXB<4> that is enabled to a logic high level when the discharge period signal FXBOFF is disabled to a logic low level.

The voltage discharge signal generation circuit 323 may generate the fifth voltage discharge signal FXB<5> by inverting the fifth internal address IADD<5> when the discharge period signal FXBOFF is enabled to a logic high level. The voltage discharge signal generation circuit 323 may generate the fifth voltage discharge signal FXB<5> that is enabled to a logic high level when the discharge period signal FXBOFF is disabled to a logic low level.

The voltage discharge signal generation circuit 323 may generate the sixth voltage discharge signal FXB<6> by inverting the sixth internal address IADD<6> when the discharge period signal FXBOFF is enabled to a logic high level. The voltage discharge signal generation circuit 323 may generate the sixth voltage discharge signal FXB<6> that is enabled to a logic high level when the discharge period signal FXBOFF is disabled to a logic low level.

The voltage discharge signal generation circuit 323 may generate the seventh voltage discharge signal FXB<7> by inverting the seventh internal address IADD<7> when the discharge period signal FXBOFF is enabled to a logic high level. The voltage discharge signal generation circuit 323 may generate the seventh voltage discharge signal FXB<7> that is enabled to a logic high level when the discharge period signal FXBOFF is disabled to a logic low level.

The voltage discharge signal generation circuit 323 may generate the eighth voltage discharge signal FXB<8> by inverting the eighth internal address IADD<8> when the discharge period signal FXBOFF is enabled to a logic high level. The voltage discharge signal generation circuit 323 may generate the eighth voltage discharge signal FXB<8> that is enabled to a logic high level when the discharge period signal FXBOFF is disabled to a logic low level.

Figure 12:
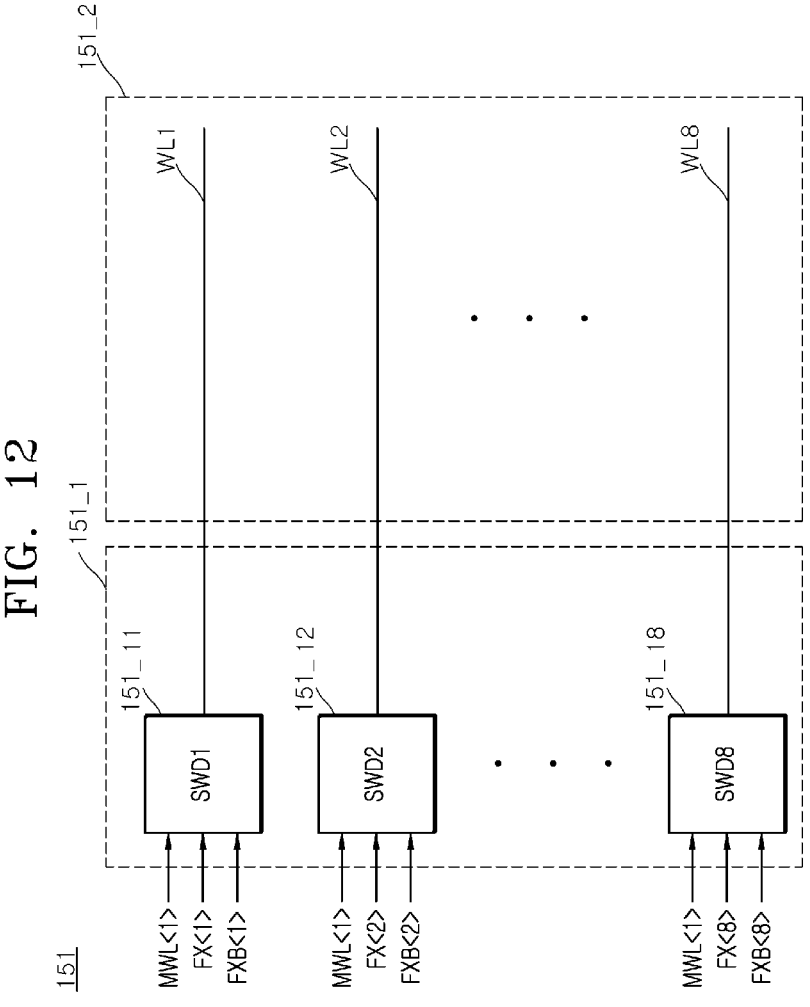
FIG. 12 is a block diagram illustrating a construction according to an embodiment of a first mat that is included in a bank illustrated in FIG. 1.

FIG. 12 is a block diagram illustrating a construction according to an embodiment of the first mat 151 that is included in the bank 150. The first mat 151 may include an internal control circuit 151_1 and a memory circuit 151_2.

The internal control circuit 151_1 may include first to eighth word line drivers (SWD1 to SWD8) 151_11 to 151_18.

The first word line driver 151_11 may be connected to the first word line WL1 that is included in the memory circuit 151_2. The first word line driver 151_11 may activate the first word line WL<1> when the first word line driving signal MWL<1> is enabled to a logic low level and the first voltage driving signal FX<1> is enabled to a logic high level. The first word line driver 151_11 may drive the first word line WL<1> to the voltage level of the first voltage driving signal FX<1> when the first word line driving signal MWL<1> is enabled to a logic low level and the first voltage driving signal FX<1> is enabled to a logic high level. The first word line driver 151_11 may deactivate the first word line WL<1> when the first word line driving signal MWL<1> is disabled to a logic high level and the first voltage discharge signal FXB<1> is enabled to a logic high level. The first word line driver 151_11 may drive the first word line WL<1> to the voltage level of the ground voltage VSS when the first word line driving signal MWL<1> is disabled to a logic high level and the first voltage discharge signal FXB<1> is enabled to a logic high level.

The second to eighth word line drivers 151_12 to 151_18 may each merely has an input signal different from the input signal of the first word line driver 151_11 and may each activate or deactivate each of the second to eighth word lines WL2 to WL8 by performing the same operation as the first word line driver 151_11. Accordingly, a detailed description of the second to eighth word line drivers 151_12 to 151_18 is omitted.

The memory circuit 151_2 may include the first to eighth word lines WL1 to WL8. Each of the first to eighth word lines WL1 to WL8 that are included in the memory circuit 151_2 may be connected to multiple bit line pairs (not illustrated) and may be connected to multiple memory cells (not illustrated). The memory circuit 151_2 may store the internal data ID in a memory cell (not illustrated) that is connected to an activated word line, among the first to eighth word lines WL1 to WL8, after the start of a write operation. The memory circuit 151_2 may be implemented by a common memory cell array.

Figure 13:
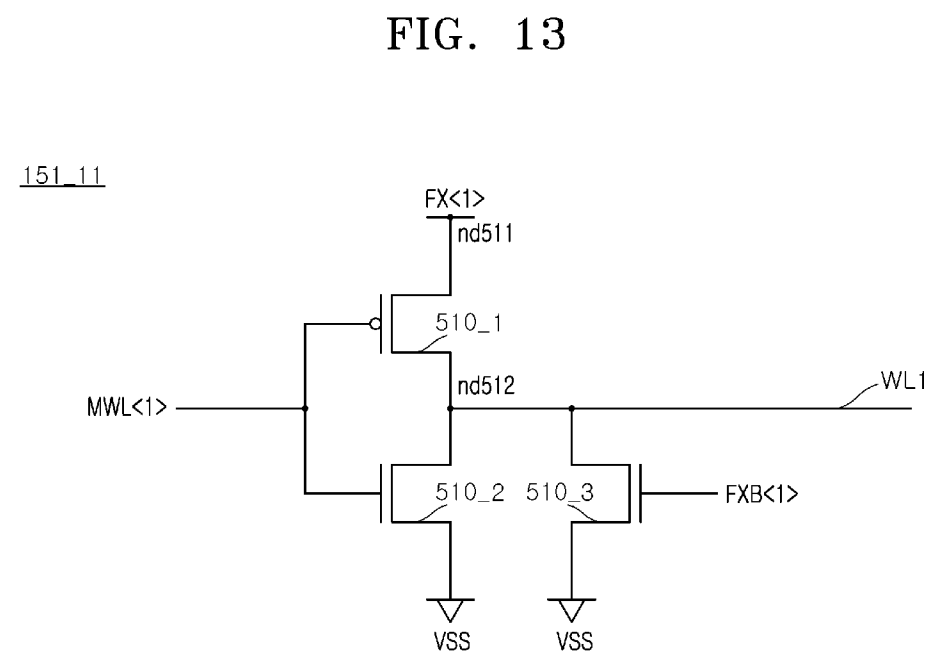

FIG. 13 is a circuit diagram illustrating a construction according to an embodiment of the first word line driver 151_11 that is included in the first mat 151.

The first word line driver 151_11 may be implemented by a pull-up element 510_1 that is disposed between a node nd511 to which the first voltage driving signal FX<1> is applied and a node nd512 that is connected to the first word line WL1, a pull-down element 510_2 that is connected between the node nd512 and the ground voltage VSS, and a discharge element 510_3 that is connected between the node nd512 and the ground voltage VSS. The first word line driver 151_11 may activate the first word line WL1 by driving the first word line WL<1> to the voltage level of the first voltage driving signal FX<1> when the first word line driving signal MWL<1> is enabled to a logic low level and the first voltage driving signal FX<1> is enabled to a logic high level. The first word line driver 151_11 may deactivate the first word line WL1 by driving the first word line WL<1> to the voltage level of the ground voltage VSS when the first word line driving signal MWL<1> is disabled to a logic high level and the first voltage discharge signal FXB<1> is enabled to a logic high level.

Figure 14:
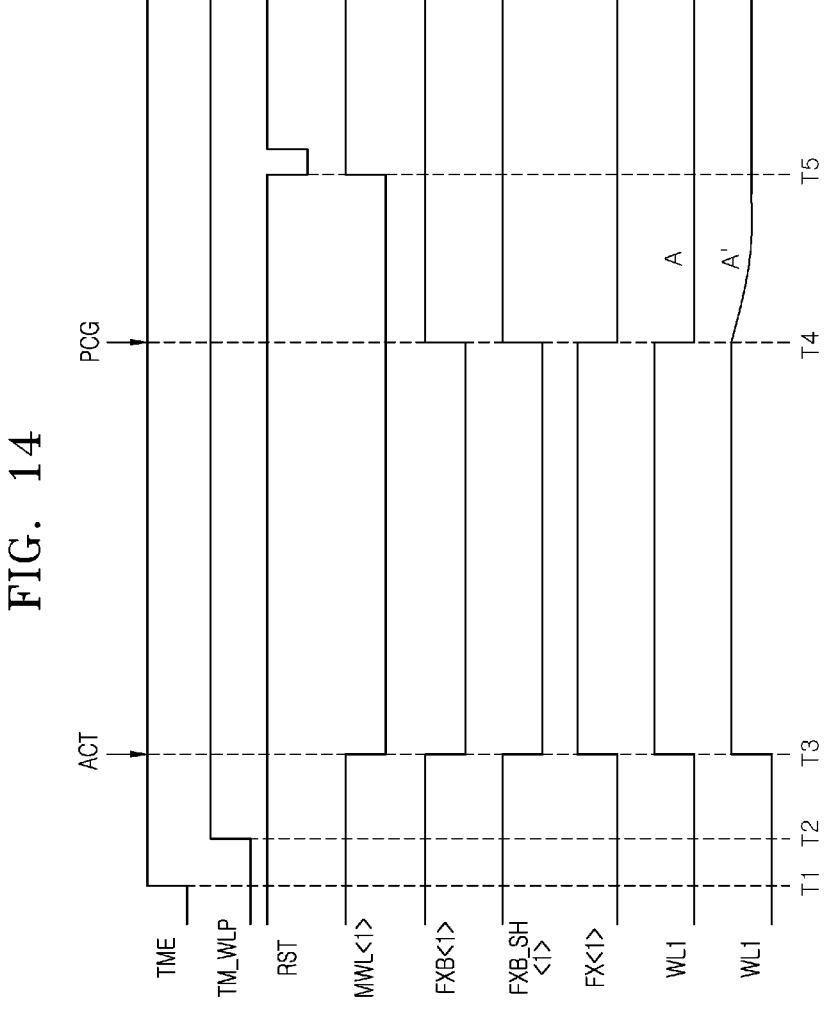
FIGS. 14, 15, 16, 17, and 18 are timing diagrams for describing a test mode of the semiconductor device according to an embodiment of the present disclosure.

An operation of the semiconductor device 1 according to an embodiment of the present disclosure is described below with reference to FIG. 14. In this case, an operation of detecting a defect in the discharge element 510_3 that is included in the first word line driver 151_11 by delaying timing at which the first word line driving signal MWL<1> is disabled by a set period in the first test mode is described as follows.

At timing T1, the test mode entry signal TME for entering the test mode is input.

At timing T2, the test control circuit 130 may generate the test word line precharge signal TM_WLP that is enabled to a logic high level based on the logic levels of the first and second test codes TCD<1:2>.

At timing T3, the command decoder 110 may generate the active signal ACT based on the command CMD for performing an active operation.

The address decoder 120 may generate the first mat enable signal MTEN<1> and the first internal address IADD<1> that are enabled to a logic high level by decoding the address ADD.

The word line control circuit 140 may generate the first word line driving signal MWL<1> having a logic low level, the first voltage discharge signal FXB<1> having a logic low level, the first pre-voltage driving signal FXB_SH<1> having a logic low level, and the first voltage driving signal FX<1> having a logic high level, based on the test word line precharge signal TM_WLP, the first mat enable signal MTEN<1>, and the first internal address IADD<1>.

The pull-up element 510_1 of the first word line driver 151_11 may be turned on by the first word line driving signal MWL<1> having a logic low level, and may activate the first word line WL1 by driving the first word line WL1 to the voltage level of the first voltage driving signal FX<1>.

At timing T4, the command decoder 110 may generate the precharge signal PCG based on the command CMD for performing a precharge operation.

The word line control circuit 140 may generate the first word line driving signal MWL<1> having a logic low level, the first voltage discharge signal FXB<1> having a logic high level, the first pre-voltage driving signal FXB_SH<1> having a logic high level, and the first voltage driving signal FX<1> having a logic low level, based on the test word line precharge signal TM_WLP, the first mat enable signal MTEN<1>, and the first internal address IADD<1>.

The pull-up element 510_1 of the first word line driver 151_11 may be turned on by the first word line driving signal MWL<1> having a logic low level, and may drive the first word line WL1 to the voltage level of the first voltage driving signal FX<1>. The discharge element 510_3 of the first word line driver 151_11 may be turned on by the first voltage discharge signal FXB<1> having a logic high level, and may drive the first word line WL1 to the voltage level of the ground voltage VSS.

At timing T5, the word line control circuit 140 may generate the first word line driving signal MWL<1> that is disabled to a logic high level by delaying timing at which the first word line driving signal MWL<1> is disabled by the reset signal RST having a logic low level by a set period A, A'.

The detection circuit 160 may detect that a defect does not occur in the word line drivers that are connected to the first to sixteenth word lines WL1 to WL16, when the first word line WL1 is driven to the voltage level of the ground voltage VSS during the set period A from the precharge operation timing T4.

The detection circuit 160 may detect that a defect occurs in the word line drivers that are connected to the first to sixteenth word lines WL1 to WL16 when the first word line WL1 is not driven to the voltage level of the ground voltage VSS during the set period A' from the precharge operation timing T4.

More specifically, when the pull-up element 510_1 of the first word line driver 151_11 is turned by the first word line driving signal MWL<1> by being delayed by the set period A, A', if the discharge element 510_3 does not drive the first word line WL1 to the voltage level of the ground voltage VSS by the first voltage discharge signal FXB<1> having a logic high level, the detection circuit 160 may detect that a defect occurs in the discharge element 510_3.

In the first test mode, the semiconductor device 1 may delay timing at which the word line driving signal is disabled by a set period, and may detect that a defect occurs in the word line drivers that are connected to the first to sixteenth word lines WL1 to WL16 when at least any one of the first to sixteenth word lines WL1 to WL16 is not driven to the voltage level of the ground voltage VSS during the set period.

Figure 15:
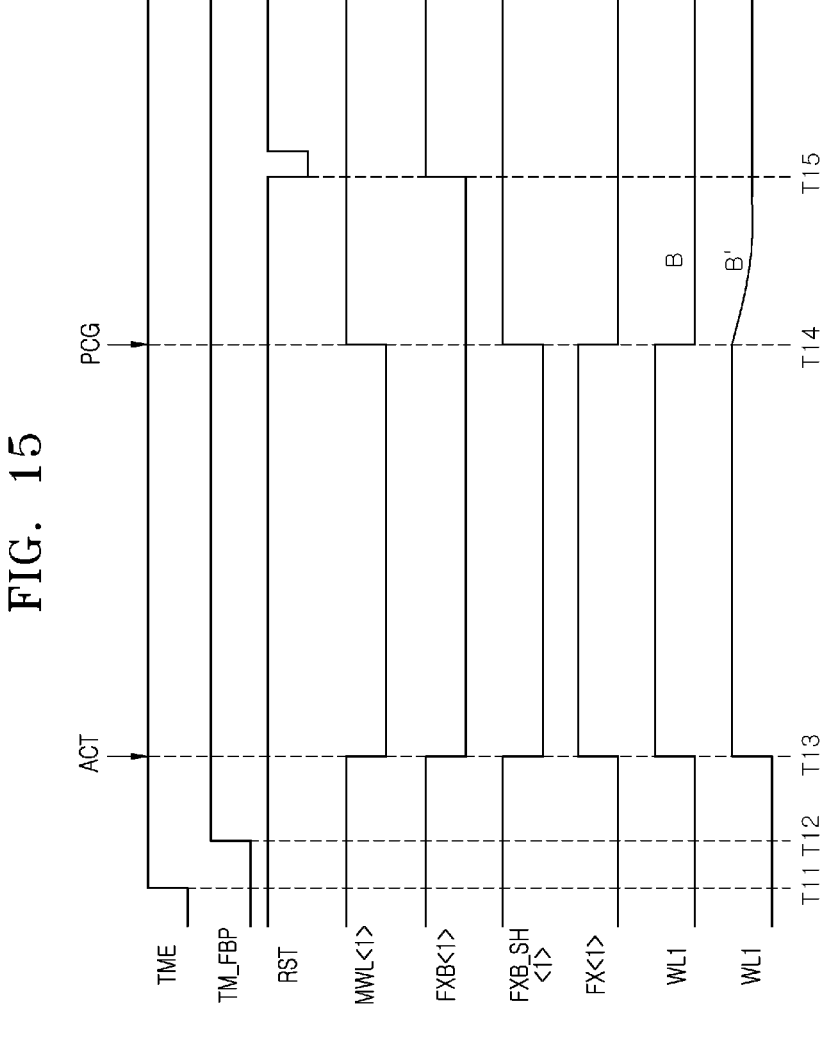

An operation of the semiconductor device 1 according to an embodiment of the present disclosure is described below with reference to FIG. 15. In this case, an operation of detecting a defect in the first word line driving signal MWL<1> that is input to the pull-up element 510_1 and the pull-down element 510_2 that are included in the first word line driver 151_11 by delaying timing at which the first voltage discharge signal FXB<1> is disabled by a set period in the second test mode is described as follows.

At timing T11, the test mode entry signal TME for entering the test mode is input.

At timing T12, the test control circuit 130 may generate the test discharge precharge signal TM_FBP that is enabled to a logic high level based on the logic levels of the first and second test codes TCD<1:2>.

At timing T13, the command decoder 110 may generate the active signal ACT based on the command CMD for performing an active operation.

The address decoder 120 may generate the first mat enable signal MTEN<1> and the first internal address IADD<1> that are enabled to a logic high level by decoding the address ADD.

The word line control circuit 140 may generate the first word line driving signal MWL<1> having a logic low level, the first voltage discharge signal FXB<1> having a logic low level, the first pre-voltage driving signal FXB_SH<1> having a logic low level, and the first voltage driving signal FX<1> having a logic high level, based on the test discharge precharge signal TM_FBP, the first mat enable signal MTEN<1>, and the first internal address IADD<1>.

The pull-up element 510_1 of the first word line driver 151_11 may be turned on by the first word line driving signal MWL<1> having a logic low level, and may activate the first word line WL1 by driving the first word line WL1 to the voltage level of the first voltage driving signal FX<1>.

At timing T14, the command decoder 110 may generate the precharge signal PCG based on the command CMD for performing a precharge operation.

The word line control circuit 140 may generate the first word line driving signal MWL<1> having a logic high level, the first voltage discharge signal FXB<1> having a logic low level, the first pre-voltage driving signal FXB_SH<1> having a logic high level, and the first voltage driving signal FX<1> having a logic low level, based on the test discharge precharge signal TM_FBP, the first mat enable signal MTEN<1>, and the first internal address IADD<1>.

The pull-down element 510_2 of the first word line driver 151_11 may be turned on by the first word line driving signal MWL<1> having a logic high level, and may drive the first word line WL1 to the voltage level of the ground voltage VSS. The discharge element 510_3 of the first word line driver 151_11 might not drive the first word line WL1 to the voltage level of the ground voltage VSS by the first voltage discharge signal FXB<1> having a logic low level.

At timing T15, the word line control circuit 140 may generate the first voltage discharge signal FXB<1> that is disabled to a logic high level by delaying timing at which the first voltage discharge signal FXB<1> is disabled by the reset signal RST having a logic low level by a set period B, B'.

The detection circuit 160 may detect that a defect does not occur in the word line drivers that are connected to the first to sixteenth word lines WL1 to WL16 when the first word line WL1 is driven to the voltage level of the ground voltage VSS during the set period B from timing T14 for the precharge operation.

The detection circuit 160 may detect that a defect occurs in the word line drivers that are connected to the first to sixteenth word lines WL1 to WL16 when the first word line WL1 is not driven to the voltage level of the ground voltage VSS during the set period B' from timing T14 for the precharge operation.

More specifically, if the pull-down element 510_2 of the first word line driver 151_11 does not drive the first word line WL1 to the voltage level of the ground voltage VSS by the first word line driving signal MWL<1> having a logic high level, the detection circuit 160 may detect that a defect occurs in the first word line driving signal MWL<1> because the first word line driving signal MWL<1> having a voltage level slightly lower or lower than a logic high level is generated.

In the second test mode, the semiconductor device 1 may delay timing at which the voltage discharge signal is disabled by a set period, and may detect that a defect occurs in the word line drivers that are connected to the first to sixteenth word lines WL1 to WL16 when at least any one of the first to sixteenth word lines WL1 to WL16 is not driven to the voltage level of the ground voltage VSS during a set period.

Figure 16:
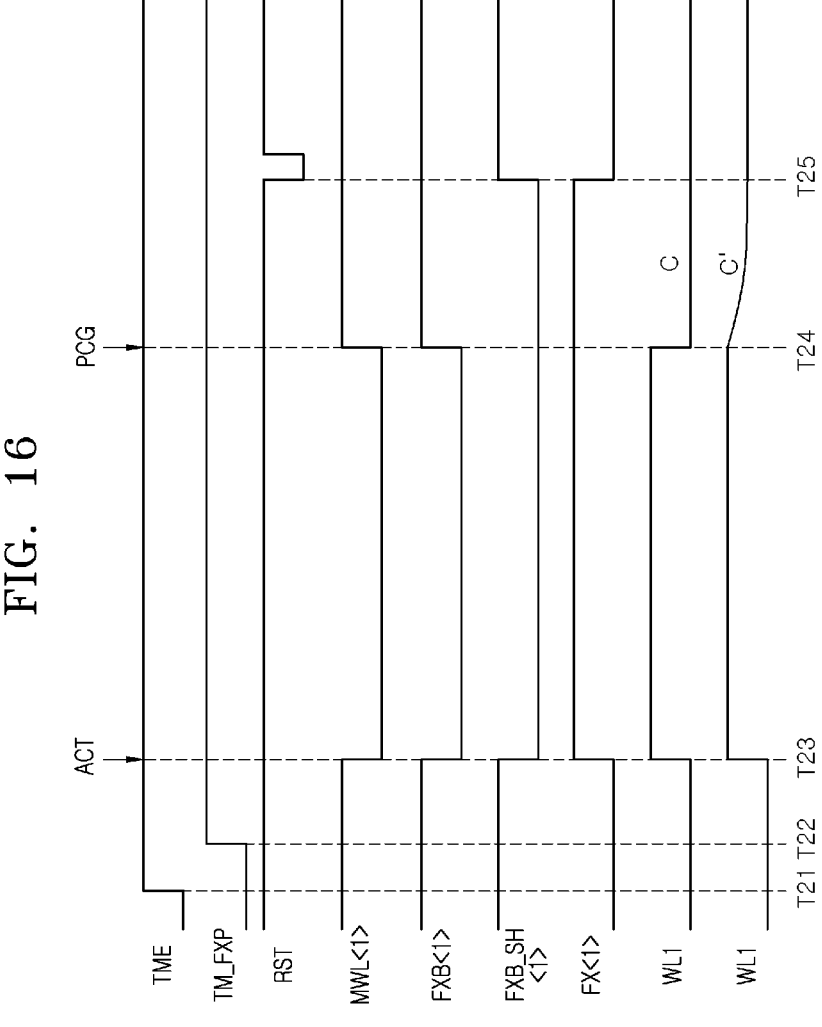

An operation of the semiconductor device 1 according to an embodiment of the present disclosure is described below with reference to FIG. 16. In this case, an operation of detecting a defect in the first word line driving signal MWL<1> that is input to the pull-up element 510_1 and the pull-down element 510_2 that are included in the first word line driver 151_11 by delaying timing at which the first voltage driving signal FX<1> is disabled by a set period in the second test mode is described as follows.

At timing T21, the test mode entry signal TME for entering the test mode is input.

At timing T22, the test control circuit 130 may generate the test driving precharge signal TM_FXP that is enabled to a logic high level based on the logic levels of the first and second test codes TCD<1:2>.

At timing T23, the command decoder 110 may generate the active signal ACT based on the command CMD for performing an active operation.

The address decoder 120 may generate the first mat enable signal MTEN<1> and the first internal address IADD<1> that are enabled to a logic high level by decoding the address ADD.

The word line control circuit 140 may generate the first word line driving signal MWL<1> having a logic low level, the first voltage discharge signal FXB<1> having a logic low level, the first pre-voltage driving signal FXB_SH<1> having a logic low level, and the first voltage driving signal FX<1> having a logic high level, based on the test driving precharge signal TM_FXP, the first mat enable signal MTEN<1>, and the first internal address IADD<1>.

The pull-up element 510_1 of the first word line driver 151_11 may be turned on by the first word line driving signal MWL<1> having a logic low level, and may activate the first word line WL1 by driving the first word line WL1 to the voltage level of the first voltage driving signal FX<1>.

At timing T24, the command decoder 110 may generate the precharge signal PCG based on the command CMD for performing a precharge operation.

The word line control circuit 140 may generate the first word line driving signal MWL<1> having a logic high level, the first voltage discharge signal FXB<1> having a logic high level, the first pre-voltage driving signal FXB_SH<1> having a logic low level, and the first voltage driving signal FX<1> having a logic high level, based on the test driving precharge signal TM_FXP, the first mat enable signal MTEN<1>, and the first internal address IADD<1>.

The pull-down element 510_2 of the first word line driver 151_11 may be turned on by the first word line driving signal MWL<1> having a logic high level, and may drive the first word line WL1 to the voltage level of the ground voltage VSS. The discharge element 510_3 of the first word line driver 151_11 may drive the first word line WL1 to the voltage level of the ground voltage VSS by the first voltage discharge signal FXB<1> having a logic high level.

At timing T25, the word line control circuit 140 may generate the first voltage driving signal FX<1> that is disabled to a logic low level by delaying timing at which the first voltage driving signal FX<1> is disabled by the reset signal RST having a logic low level by a set period C, C'.

The detection circuit 160 may detect that a defect does not occur in the word line drivers that are connected to the first to sixteenth word lines WL1 to WL16 when the first word line WL1 is driven to the voltage level of the ground voltage VSS during the set period C from timing T24 for the precharge operation.

The detection circuit 160 may detect that a defect occurs in the word line drivers that are connected to the first to sixteenth word lines WL1 to WL16 when the first word line WL1 is not driven to the voltage level of the ground voltage VSS during the set period C' from timing T24 for the precharge operation.

More specifically, if the pull-down element 510_2 of the first word line driver 151_11 does not drive the first word line WL1 to the voltage level of the ground voltage VSS by the first word line driving signal MWL<1> having a logic high level, the detection circuit 160 may detect that a defect occurs in the first word line driving signal MWL<1> because the first word line driving signal MWL<1> having a voltage level slightly higher or higher than a logic low level is generated.

In the second test mode, the semiconductor device 1 may delay timing at which the voltage driving signal is disabled by a set period, and may detect that a defect occurs in the word line drivers that are connected to the first to sixteenth word lines WL1 to WL16 when at least any one of the first to sixteenth word lines WL1 to WL16 is not driven to the voltage level of the ground voltage VSS during the set period.

Figure 17:
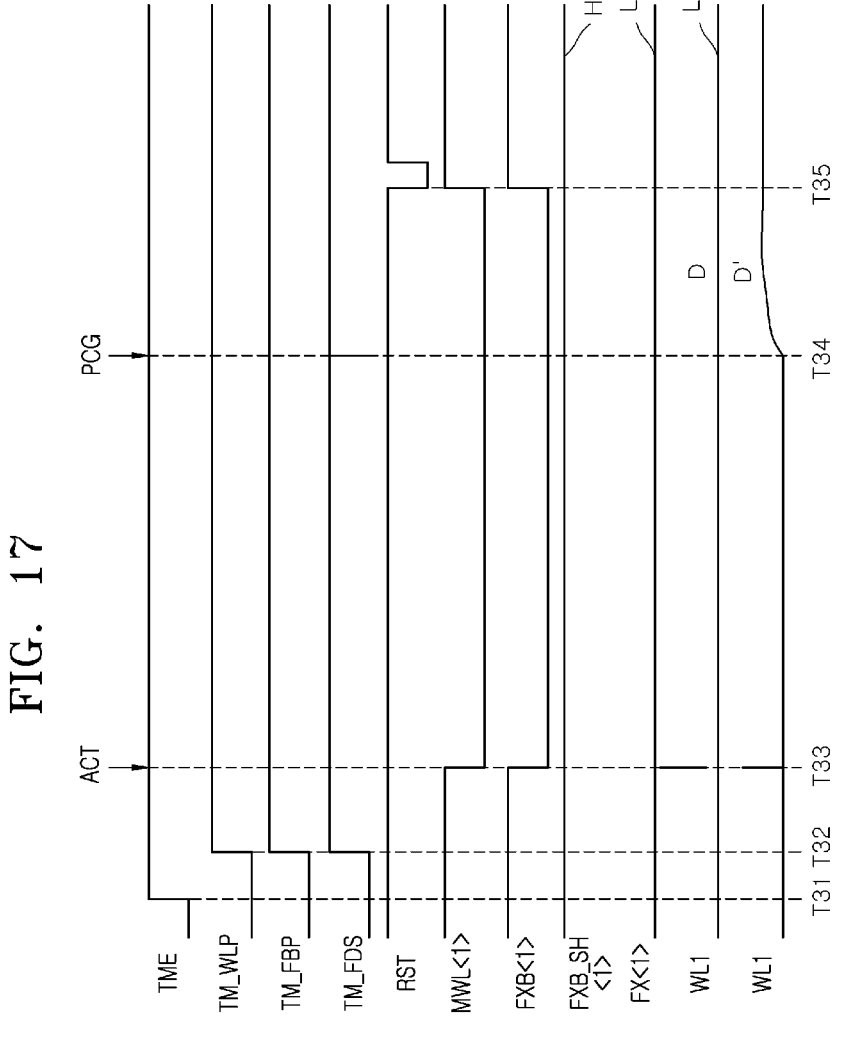

An operation of the semiconductor device 1 according to an embodiment of the present disclosure is described below with reference to FIG. 17. In this case, the operation of the semiconductor device 1 may be set as an operation of detecting a defect in the first to sixteenth word lines WL1 to WL16 by delaying timing at which the first word line driving signal MWL<1> and the first voltage discharge signal FXB<1> are disabled by a set period in the third test mode.

At timing T31, the test mode entry signal TME for entering the test mode is input.

At timing T32, the test control circuit 130 may generate the test word line precharge signal TM_WLP, the test discharge precharge signal TM_FBP, and the test driving disable signal TM_FDS that are enabled to a logic high level, based on the logic levels of the first and second test codes TCD<1:2>.

At timing T33, the command decoder 110 may generate the active signal ACT based on the command CMD for performing an active operation.

The address decoder 120 may generate the first mat enable signal MTEN<1> and the first internal address IADD<1> that are enabled to a logic high level, by decoding the address ADD.

The word line control circuit 140 may generate the first word line driving signal MWL<1> having a logic low level, the first voltage discharge signal FXB<1> having a logic low level, the first pre-voltage driving signal FXB_SH<1> having a logic high level, and the first voltage driving signal FX<1> having a logic low level, based on the test word line precharge signal TM_WLP, the test discharge precharge signal TM_FBP, the test driving disable signal TM_FDS, the first mat enable signal MTEN<1>, and the first internal address IADD<1>.

The pull-up element 510_1 of the first word line driver 151_11 may be turned on by the first word line driving signal MWL<1> having a logic low level, and may drive the first word line WL1 to the voltage level of the first voltage driving signal FX<1>. At this time, the first word line WL1 may be driven to a logic low level.

At timing T34, the command decoder 110 may generate the precharge signal PCG based on the command CMD for performing a precharge operation.

The word line control circuit 140 may generate the first word line driving signal MWL<1> having a logic low level, the first voltage discharge signal FXB<1> having a logic low level, the first pre-voltage driving signal FXB_SH<1> having a logic high level, and the first voltage driving signal FX<1> having a logic low level, based on the test word line precharge signal TM_WLP, the test discharge precharge signal TM_FBP, the test driving disable signal TM_FDS, the first mat enable signal MTEN<1>, and the first internal address IADD<1>.

The pull-up element 510_1 of the first word line driver 151_11 may be turned on by the first word line driving signal MWL<1> having a logic low level, and may drive the first word line WL1 to the voltage level of the first voltage driving signal FX<1>. The discharge element 510_3 of the first word line driver 151_11 may be turned on by the first voltage discharge signal FXB<1> having a logic high level, and may drive the first word line WL1 to the voltage level of the ground voltage VSS.

At timing T35, the word line control circuit 140 may generate the first word line driving signal MWL<1> that is disabled to a logic high level by delaying timing at which the first word line driving signal MWL<1> is disabled by the reset signal RST having a logic low level by a set period D, D'.

The detection circuit 160 may detect that a bridge defect in which the first word line WL1 and the second word line WL2 are connected does not occur, when the first word line WL1 is driven to the voltage level of the ground voltage VSS during the set period D from timing T34 for the precharge operation.

The detection circuit 160 may detect a bridge defect in which the first word line WL1 and the second word line WL2 are connected, when the first word line WL1 is not driven to the voltage level of the ground voltage VSS during the set period D' from timing T34 for the precharge operation.

More specifically, if the pull-up element 510_1 of the first word line driver 151_11 is turned on by the first word line driving signal MWL<1> by being delayed by the set period D, D', and drives the first word line WL1 to the voltage level of the first voltage driving signal FX<1> having a logic low level and the discharge element 510_3 does not drive the first word line WL1 to the voltage level of the ground voltage VSS by the first voltage discharge signal FXB<1> having a logic high level, the detection circuit 160 may detect that a bridge defect in which the first word line WL1 and the second word line WL2 are connected occurs.

In the third test mode, the semiconductor device 1 may delay timing at which the word line driving signal and the voltage driving signal are disabled by a set period, and may detect that a bridge defect in which the first to sixteenth word lines WL1 to WL16 are connected occurs when at least any one of the first to sixteenth word lines WL1 to WL16 is not driven to the voltage level of the ground voltage VSS during a set period.

Figure 18:
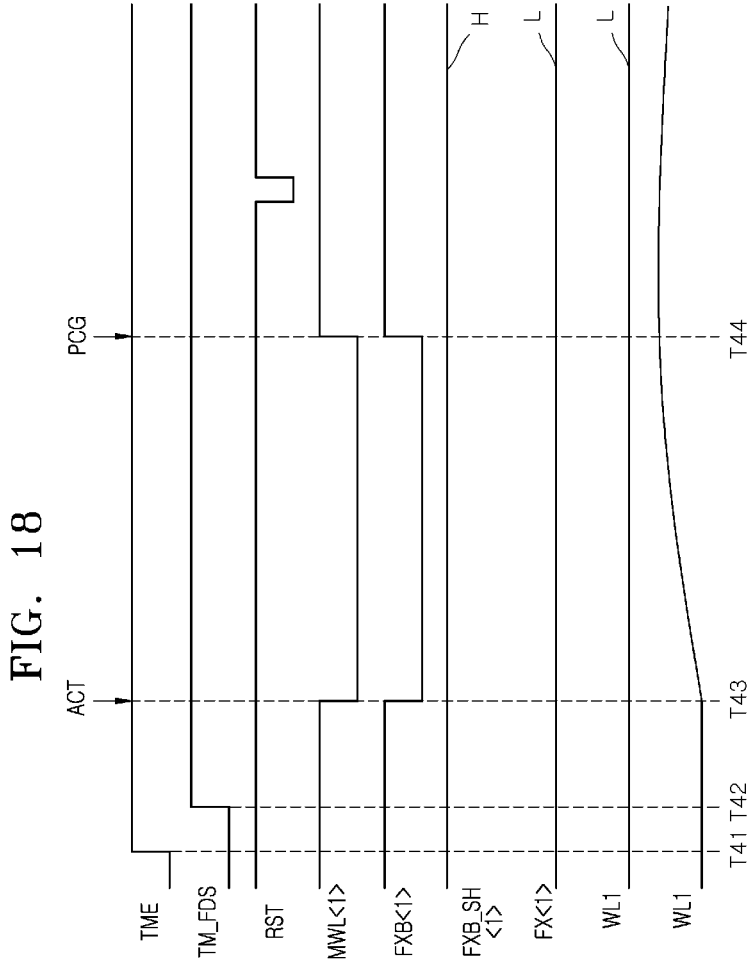

An operation of the semiconductor device 1 according to an embodiment of the present disclosure is described below with reference to FIG. 18. In this case, the operation of the semiconductor device 1 may be set as an operation of detecting a defect in the first to sixteenth word lines WL1 to WL16 by disabling the first voltage driving signal FX<1> in the fourth test mode.

At timing T41, the test mode entry signal TME for entering the test mode is input.

At timing T42, the test control circuit 130 may generate the test driving disable signal TM_FDS that is enabled to a logic high level based on the logic levels of the first and second test codes TCD<1:2>.

At timing T43, the command decoder 110 may generate the active signal ACT based on the command CMD for performing an active operation.

The address decoder 120 may generate the first mat enable signal MTEN<1> and the first internal address IADD<1> that are enabled to a logic high level by decoding the address ADD.

The word line control circuit 140 may generate the first word line driving signal MWL<1> having a logic low level, the first voltage discharge signal FXB<1> having a logic low level, the first pre-voltage driving signal FXB_SH<1> having a logic high level, and the first voltage driving signal FX<1> having a logic low level, based on the test driving disable signal TM_FDS, the first mat enable signal MTEN<1>, and the first internal address IADD<1>.

The pull-up element 510_1 of the first word line driver 151_11 may be turned on by the first word line driving signal MWL<1> having a logic low level, and may drive the first word line WL1 to the voltage level of the first voltage driving signal FX<1>. At this time, the first word line WL1 may be driven to a logic low level.

At timing T44, the command decoder 110 may generate the precharge signal PCG based on the command CMD for performing a precharge operation.

The word line control circuit 140 may generate the first word line driving signal MWL<1> having a logic high level, the first voltage discharge signal FXB<1> having a logic high level, the first pre-voltage driving signal FXB_SH<1> having a logic high level, and the first voltage driving signal FX<1> having a logic low level, based on the test driving disable signal TM_FDS, the first mat enable signal MTEN<1>, and the first internal address IADD<1>.

The pull-down element 510_2 of the first word line driver 151_11 may be turned on by the first word line driving signal MWL<1> having a logic high level, and may drive the first word line WL1 to the voltage level of the first voltage driving signal FX<1>. The discharge element 510_3 of the first word line driver 151_11 may be turned on by the first voltage discharge signal FXB<1> having a logic high level, and may drive the first word line WL1 to the voltage level of the ground voltage VSS.

The detection circuit 160 may detect that a bridge defect in which the first word line WL1 and the second word line WL2 are connected does not occur when the first word line WL1 is not driven to the voltage level of the ground voltage VSS from timing T43 for the active operation to timing T44 for the precharge operation.

The detection circuit 160 may detect a bridge defect in which the first word line WL1 and the second word line WL2 are connected when the first word line WL1 is not driven to the voltage level of the ground voltage VSS from timing T43 for the active operation to timing T44 for the precharge operation.

More specifically, if the pull-down element 510_2 of the first word line driver 151_11 is turned on by the first word line driving signal MWL<1> and drives the first word line WL1 to the voltage level of the first voltage driving signal FX<1> having a logic low level and the discharge element 510_3 of the first word line driver 151_11 does not drive the first word line WL1 to the voltage level of the ground voltage VSS by the first voltage discharge signal FXB<1> having a logic high level, the detection circuit 160 may detect that a bridge defect in which the first word line WL1 and the second word line WL2 are connected occurs.

In the third test mode, the semiconductor device 1 may delay timing at which the word line driving signal and the voltage driving signal are disabled by a set period, and may detect that a bridge defect in which the first to sixteenth word lines WL1 to WL16 are connected occurs when at least any one of the first to sixteenth word lines WL1 to WL16 is not driven to the voltage level of the ground voltage VSS during the set period.

Figure 19:
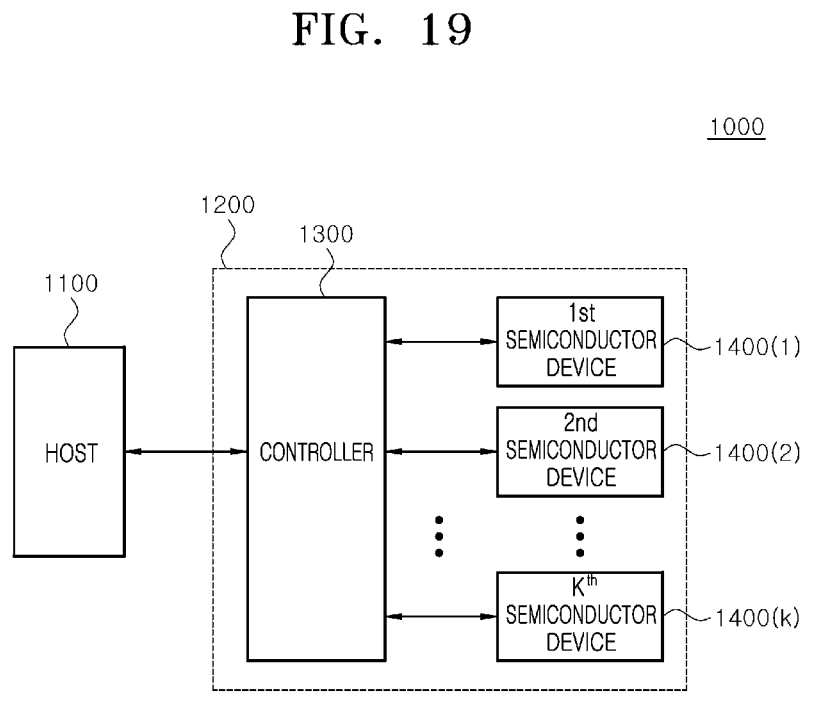

FIG. 19 is a block diagram illustrating a construction according to an embodiment of an electronic system 1000 according to an embodiment of the present disclosure. As illustrated in FIG. 19, the electronic system 1000 may include a host 1100 and a semiconductor system 1200.

The host 1100 and the semiconductor system 1200 may mutually transmit signals by using an interface protocol. The interface protocol that is used between the host 1100 and the semiconductor system 1200 may include a multi-media card (MMC), an enhanced small disk interface (ESDI), integrated drive electronics (IDE), peripheral component interconnect-express (PCI-E), advanced technology attachment (ATA), serial ATA (SATA), parallel ATA (PATA), a serial attached SCSI (SAS), a universal serial bus (USB).

The semiconductor system 1200 may include a controller 1300 and semiconductor devices 1400 (K:1). The controller 1300 may control the semiconductor devices 1400 (K:1) so that an active operation, write operation, precharge operation, and test mode of the semiconductor devices 1400 (K:1) are performed. Each of the semiconductor devices 1400 (K:1) may detect a defect in the plurality of word line drivers by detecting the levels of the plurality of word lines, by delaying timing at which a word line driving signal that is input to the plurality of word line drivers connected to the plurality of word lines is disabled by a set period after the start of a precharge operation in the first test mode. Each of the semiconductor devices 1400 (K:1) may detect a defect in the plurality of word line drivers by detecting the levels of the plurality of word lines, by delaying timing at which the voltage driving signal and the voltage discharge signal that are input to the plurality of word line drivers connected to the plurality of word lines is disabled by a set period after the start of a precharge operation in the second test mode. Each of the semiconductor devices 1400 (K:1) may detect a defect in the plurality of word lines by detecting the levels of the plurality of word lines, by delaying timing at which the word line driving signal and the voltage driving signal that are input to the plurality of word line drivers connected to the plurality of word lines are disabled by a set period after the start of a precharge operation in the third test mode. Each of the semiconductor devices 1400 (K:1) may detect a defect in the plurality of word lines by detecting the levels of the plurality of word lines, by disabling the voltage driving signal in the fourth test mode.

Each of the semiconductor devices 1400 (1:K) may be implemented by the semiconductor device 1 illustrated FIG. 1. According to an embodiment, each of the semiconductor devices 1400 (1:K) may be implemented as one of dynamic random access memory (DRAM), phase change random access memory (PRAM), resistive random access memory (RRAM), magnetic random access memory (MRAM), and ferroelectric random access memory (FRAM).

What is claimed is:

1. A semiconductor device comprising:

a test control circuit configured to enter a test mode and configured to generate a test word line precharge signal, based on a test mode entry signal, an active pulse, a precharge pulse, a reset signal, and a test code;

a mat comprising a plurality of word line drivers; and a word line control circuit configured to generate a word line driving signal, a plurality of voltage driving signals, and a plurality of voltage discharge signals for controlling operations of the plurality of word line drivers, based on the test word line precharge signal, a mat enable signal, and a plurality of internal addresses, wherein the word line driving signal is a signal that is enabled after a start of an active operation and that is disabled after a set period from timing for a precharge operation, wherein the mat performs the active operation to activate any one of a plurality of word lines, and performs the precharge operation to drive the plurality of word lines to a ground voltage.

2. The semiconductor device of claim 1, wherein the plurality of word line drivers are connected to the plurality of word lines, respectively, wherein the plurality of word lines are included in the mat, wherein the plurality of word line drivers are configured to activate any one of the plurality of word lines after the start of the active operation, and wherein the plurality of word line drivers are configured to drive the plurality of word lines to a voltage level of the ground voltage in the precharge operation.

3. The semiconductor device of claim 1, wherein the plurality of word line drivers drive the plurality of word lines, respectively, to a voltage level of a ground voltage when the plurality of voltage discharge signals is enabled during an interval in which the word line driving signal is enabled after the start of the precharge operation, and wherein the plurality of word lines are included in the mat.

4. The semiconductor device of claim 1, wherein the test control circuit comprises:

a test mergence signal generation circuit configured to generate a test mergence signal, wherein the test mergence signal is enabled during the set period after the precharge operation, based on the test mode entry signal, the precharge pulse, and the reset signal;

a test decoder configured to generate a pre-word line precharge signal by decoding the test code; and a test signal generation circuit configured to generate the test word line precharge signal, based on the active pulse, the test mergence signal, and the pre-word line precharge signal.

5. The semiconductor device of claim 4, wherein the test mergence signal generation circuit comprises:

a test pulse generation circuit configured to generate a test set pulse based on the precharge pulse during an interval in which the test mode entry signal is enabled and configured to generate a test reset pulse based on the reset signal during the interval in which the test mode entry signal is enabled; and a latch circuit configured to generate the test mergence signal, wherein the test mergence signal is enabled by a pulse of the test set pulse, and wherein the test mergence signal is disabled by a pulse of the test reset pulse.

6. The semiconductor device of claim 4, wherein:

the test signal generation circuit is configured to generate the test word line precharge signal, wherein the test word line precharge signal is enabled by a pulse of the active pulse, and the test signal generation circuit is configured to generate the test word line precharge signal, wherein the test word line precharge signal is enabled by the test mergence signal and the pre-word line precharge signal.

7. The semiconductor device of claim 1, wherein the word line control circuit comprises:

a period signal generation circuit configured to generate a word line period signal based on a bank enable signal and the test word line precharge signal; and a driving signal generation circuit configured to generate the word line driving signal based on the mat enable signal and the word line period signal and configured to generate the plurality of voltage driving signals and the plurality of voltage discharge signals based on the plurality of internal addresses.

8. The semiconductor device of claim 7, wherein:

the period signal generation circuit is configured to generate the word line period signal, wherein the word line period signal is enabled based on a pulse of the bank enable signal, and wherein the bank enable signal is enabled after the start of the active operation, and the period signal generation circuit is configured to generate the word line period signal, wherein the word line period signal is disabled based on the test word line precharge signal.

9. The semiconductor device of claim 7, wherein the driving signal generation circuit comprises:

a word line driving signal generation circuit configured to generate the word line driving signal based on the mat enable signal when the word line period signal is enabled;

a voltage driving signal generation circuit configured to generate the plurality of voltage driving signals, wherein the plurality of voltage driving signals are selectively enabled based on the plurality of internal addresses; and a voltage discharge signal generation circuit configured to generate the plurality of voltage discharge signals, wherein the plurality of voltage discharge signals are selectively enabled based on the plurality of internal addresses.

10. The semiconductor device of claim 1, further comprising a detection circuit configured to detect an occurrence of a defect in the plurality of word line drivers when at least any one of the plurality of word lines connected to the plurality of word line drivers is not driven to a voltage level of a ground voltage during the set period.

11. The semiconductor device of claim 1, further comprising:

a first mat comprising a plurality of word line drivers; and a second mat comprising a plurality of word line drivers, wherein the word line control circuit is configured to:

generate a first word line driving signal, the plurality of voltage driving signals, and the plurality of voltage discharge signals for controlling operations of the plurality of word line drivers included in the first mat, based on the test word line precharge signal and the plurality of internal addresses, when a first mat enable signal for activating the first mat is enabled after the start of the active operation, and generate a second word line driving signal, the plurality of voltage driving signals, and the plurality of voltage discharge signals for controlling operations of the plurality of word line drivers included in the second mat, based on the test word line precharge signal, the plurality of internal addresses, when a second mat enable signal for activating the second mat is enabled.

12. The semiconductor device of claim 11, wherein the plurality of word line drivers included in the first mat are connected to the plurality of word lines, respectively, and are configured to activate any one of the plurality of word lines included in the first mat after the start of the active operation and configured to drive the plurality of word lines to a voltage level of a ground voltage in the precharge operation.

13. The semiconductor device of claim 11, wherein the plurality of word line drivers included in the second mat are connected to the plurality of word lines, respectively, and are configured to activate any one of the plurality of word lines that is included in the second mat after the start of the active operation and configured to drive the plurality of word lines to a voltage level of a ground voltage in the precharge operation.

14. The semiconductor device of claim 11, wherein the plurality of word line drivers included in the first mat are configured to drive, respectively, the plurality of word lines included in the first mat to a voltage level of a ground voltage, when the plurality of voltage discharge signals is enabled during an interval in which the first word line driving signal is enabled after the start of the precharge operation.

15. The semiconductor device of claim 11, wherein the plurality of word line drivers included in the second mat are configured to drive, respectively, the plurality of word lines included in the second mat to a voltage level of a ground voltage, when the plurality of voltage discharge signals is enabled during an interval in which the second word line driving signal is enabled after the start of the precharge operation.

* * * * *